United States Patent
Adachi et al.

Patent Number: 5,684,832
Date of Patent: Nov. 4, 1997

[54] MAXIMUM LIKELIHOOD DIFFERENTIAL DETECTING METHOD AND DIFFERENTIAL DETECTOR THEREOF

[75] Inventors: Fumiyuki Adachi, Yokohama; Mamoru Sawahashi, Yokosuka; Tomohiro Dohi, Yokohama, all of Japan

[73] Assignee: NTT Mobile Communications Network, Tokyo, Japan

[21] Appl. No.: 374,784

[22] PCT Filed: Jun. 2, 1994

[86] PCT No.: PCT/JP94/00890

§ 371 Date: Jan. 30, 1995

§ 102(e) Date: Jan. 30, 1995

[87] PCT Pub. No.: WO94/29990

PCT Pub. Date: Dec. 22, 1994

[30] Foreign Application Priority Data

Jun. 4, 1993 [JP] Japan ............... 5-134221
Oct. 14, 1993 [JP] Japan ............... 5-256785
Nov. 17, 1993 [JP] Japan ............... 5-288056

[51] Int. Cl.[6] ............... H04L 5/12; H04L 23/02
[52] U.S. Cl. ............... 375/262; 375/331; 375/341; 371/43; 329/306
[58] Field of Search ............... 375/262, 329, 375/330, 331, 332, 341; 371/43; 329/304, 306

[56] References Cited

U.S. PATENT DOCUMENTS

| | | | |
|---|---|---|---|
| 5,263,053 | 11/1993 | Wan et al. | 375/241 |
| 5,272,726 | 12/1993 | Furuya et al. | 375/341 |
| 5,325,402 | 6/1994 | Ushirokawa | 375/341 |
| 5,331,666 | 7/1994 | Dent | 375/341 |

OTHER PUBLICATIONS

Makrakis et al., "Optimal Noncoherent Detection of PSK Signals", Electronics Letters, vol. 26, No. 6, pp. 398–400, Mar. 1990.

Divsalar et al., "Multiple–Symbol Differential Detection of MPSK", IEEE, vol. 38, No. 3, pp. 300–308, Mar. 1990.

*Primary Examiner*—Stephen Chin
*Assistant Examiner*—Don Vo

[57] ABSTRACT

The phase of a received signal is detected by a phase detector at symbol intervals T relative to the phase of a local signal. The detected phase is input to delay circuits that are connected in series and each of which has the delay interval T. Phases $\Psi_n$ (where n=0, 1, ..., N) with delays of 1 to N symbols are output to a metric calculating portion. The sum of a partial sequence $\{\Delta\phi_i; i=n+1-q, n+2-q, ..., n\}$ of a N-symbol phase difference sequence candidate $\{\Delta\phi_n; n=0, 1, ..., N\}$ is added to a detected phase $\Psi_{n-q}$ at a time point $(n-q)T$ (where q=1, 2, ..., N) so as to obtain an estimated value of the received signal phase $\Psi_n$. The v-th power value of the absolute value of a difference $\mu_n(q)$ between the estimated value and the received signal phase is defined as a branch metric of q-symbol differential phase detection. $\Sigma|\mu_n(q)|^v = \lambda_n$, which the summation of metrics from q=1 to n, is defined as a branch metric at the time point nT. A path metric $\Lambda = \Sigma\lambda_n$, which is the summation of branch metrics from a time point 1T to a time point NT, is calculated for all N-symbol phase difference candidates. A candidate sequence with a minimum value is decided as a decoded sequence.

16 Claims, 13 Drawing Sheets

FIG.9

| L | REFERENCE 1<br>$M^L/L$ | REFERENCE 2<br>$M^L$ | PRESENT INVENTION<br>$M^2$ |
|---|---|---|---|
| 2 | 8 | 16 | 16 |
| 3 | 21.3 | 64 | 16 |
| 4 | 64 | 256 | 16 |
| 6 | 682.7 | 4096 | 16 |
| 8 | 8192 | 65536 | 16 |
| 10 | 104857.6 | 1048576 | 16 |

MAXIMUM LIKELIHOOD DIFFERENTIAL DETECTING METHOD AND DIFFERENTIAL DETECTOR THEREOF

TECHNICAL FIELD

The present invention relates to a differential detecting method for differentially detecting a digital signal transmitted as a phase difference sequence in a symbol interval and for obtaining a decoded sequence, and, more particularly it relates to a differential detecting method and a differential detector thereof corresponding to a maximum likelihood sequence estimation technique.

RELATED ART

Phase modulated waves are conventionally demodulated by coherent detection and differential detection. In coherent detection, the receiver side reproduces a carrier wave as a reference signal, measures the phase of a received wave corresponding to the reference signal, and estimates a transmitted code. In this case, since the absolute phase is unknown, the sender side generally uses differential phase shift-keying modulation (DPSK) that modulates information corresponding to the variation of the phase of the carrier wave. Since the reproduced reference signal is not affected by noise and the like, a low error rate can be accomplished.

On the other hand, as differential detection, differential phase detection and quadrature differential detection have been widely used. In differential detection, the reference wave is formed of a received wave with a delay of one symbol interval. Thus, since no carrier wave reproducing circuit is required, the detecting circuit can be simply constructed and the detecting operation can be performed at high speed. Consequently, differential detection is suitable for receiving a burst signal in time division multiple access (TDMA) communication. However, since the signal with a delay of one symbol interval is used as the reference signal, the reference signal tends to be adversely affected by thermal noise and the like. Thus, the error rate of differential detection degrades in comparison with that of coherent detection. As a result, depending on whether the detecting circuit is complicated, the burst signal is received, and so forth, either coherent detection or differential detection is selected.

For example, for four-phase DPSK, at a bit error rate 0.1%, the difference in bit energy-to-noise rate (Eb/No) between differential detection and coherent detection is 1.8 dB. To reduce the difference, a maximum likelihood quadrature differential detection for estimating a transmitted data sequence has been proposed as in Reference 1. The quadrature differential detector is composed of delay devices and multipliers. (Reference 1: D. Divsalar and M. K. Simon, "Multiple-symbol differential detection of MPSK," IEEE Trans. Commun., vol. 38, pp. 300–308, March 1990.) In addition, a technique for recursive estimation using the Viterbi algorithm has been proposed as in Reference 2. (Reference 2: D. Makrakis and K. Feher, "Optimal noncoherent detection of PSK signals," Electronics Letters, vol. 26, pp. 398–400, March 1990.)

Assuming that an N-symbol phase difference sequence $\Delta\phi_n$ (where $n=1, 2, \ldots, N$) is being transmitted, the received signal is quadrature-differentially detected and a maximum likelihood sequence estimation is applied. M-phase DPSK signals that are received in an interval $(n-1)T \leq t < nT$ can be given in the complex representation as follows:

$$z(t)=(2Es/T)^{1/2} \exp j\, [\phi_n+\theta]+w(t) \tag{01}$$

where $\phi_n=\{2m\pi/M; m=0, 1, \ldots, M-1\}$ is a modulated phase; Es is energy per symbol; T is one symbol interval; $\theta$ is a phase difference between a received wave and a locally oscillated wave of the receiver; w(t) is noise of the receiver; and $\Delta\phi_n=\phi_n-\phi_{n-1}$ is the n-th phase difference. After z(t) is filtered, it is sampled in the symbol interval. The obtained signal sample sequence is denoted by $\{Z_n; n=0, 1, \ldots, N\}$. In the technique of Reference 1, a sequence that maximizes a metric given by the following equation is selected:

$$\Lambda=|z_N+z_{N-1} \exp j\, \Delta\phi_N+z_{N-2} \exp j(\Delta\phi_N+\Delta\phi_{N-1})+ \ldots +z_0 \exp j\, (\Delta\phi_N+\Delta\phi_{N-1}+ \ldots +\Delta\phi_1)|^2 \tag{02}$$

Equation (02) can be modified as the following equation:

$$\Lambda = \sum_{n=1}^{N} Re\left[ z_n \sum_{q=1}^{n} z_{n-q} \exp j(\Delta\phi_n + \Delta\phi_{n-1} + \ldots + \Delta\phi_{n-q+1})\}^* \right] \tag{03}$$

where Re[.] is the real part of a complex number; and ( )* is a conjugate complex. In the technique of Reference 2, phase difference sequences are successively estimated based on the $M^{L-1}$ state Viterbi algorithm using a branch metric defined as follows:

$$\lambda_n = Re\left[ Z_n \left\{ \sum_{q=1}^{L} z_{n-q} \exp j(\Delta\phi_n + \Delta\phi_{n-1} + \ldots + \Delta\phi_{n-q+1}) \right\} * \right] \tag{04}$$

assuming that the upper limit of the summation with respect to q in equation (03) is L (<N).

In other words, in the maximum likelihood sequence estimation according to Reference 1, metrics of all N-sequences of (N+1) received signal samples in the symbol interval T are calculated and a sequence with the maximum metric is output. Thus, the number of times of the metric calculation becomes $M^N$. In other words, the number of times of the calculation per symbol is $M^N/N$.

On the other hand, in the maximum likelihood sequence estimation corresponding to the Viterbi decoding described in Reference 2, there are $M^{L-1}$ phase difference sequences. A maximum likelihood path at each time point is selected. Since each state has arriving paths from M states out of $M^{L-1}$ states at the just preceding time point, the number of times of the metric calculation becomes $M^{L-1} \times M = M^L$. Thus, the number of times of the metric calculation does not depend on the length of the transmitted symbol sequence. Consequently, the number of times of the metric calculation of Reference 2 is much reduced in comparison with that of Reference 1. However, as the modulation level M of the modulation increases, the amount of calculating process exponentially increases.

An object of the present invention is to provide a maximum likelihood decoding and differential detecting method and a differential detector thereof that provide an error rate equal to or lower than a conventional maximum likelihood sequence estimation method with lesser calculation complexity or that much lower error rate with the same calculation complexity as the conventional maximum likelihood sequence estimation method without a tradeoff of maximum transmission data rate.

DISCLOSURE OF THE INVENTION

A first aspect of the present invention is a differential phase detecting method of an M-phase DPSK modulated signal, comprising the steps of detecting a phase $\Psi_n$ of a received wave at each transmitted symbol interval T with reference to a local signal at a time point nT, where n is any integer, tracing back a candidate of N-symbol phase difference sequence $\{\Delta\phi_n; n=1, 2, \ldots, N\}$ for q symbols so as to form a partial sequence $\{\Delta\phi_i; i=n, n-1, \ldots, n+1-q\}$ and adding the sum of the partial sequence $\{\Delta\phi_i; i=n, n-1, \ldots, n+1-q\}$ to a detected phase $\Psi_{n-q}$ of q preceding symbols so as to obtain an estimated value $\Psi_n'$ of the phase $\Psi_n$, defining the v-th power value of the absolute value of a difference $\mu_n(q)$ between the estimated value $\Psi_n'$ and the phase $\Psi_n$ as a metric of a q-symbol differential phase detection, where v is a real number that is 1 or greater, adding the metric from q=1 to n so as to obtain the following branch metric $\lambda_n=|\mu_n(1)|^v+|\mu_n(2)|^v+\ldots+|\mu_n(n)|^v$, adding the branch metric from n=1 to N so as to obtain a path metric $\Lambda=\lambda_1+\lambda_2+\ldots+\lambda_N$ for the candidate of phase difference sequence $\{\Delta\phi_n; i=1, 2, \ldots, N\}$, and defining an N-symbol phase difference sequence with the minimum path metric as a decoded sequence and outputting the decoded sequence.

A second aspect of the present invention is a differential phase detecting method of an M-phase DPSK modulated signal, the differential phase detecting method using a path memory and a path metric memory, the path memory being adapted for storing both $M^{Q-1}$ states (where Q is a predetermined integer that is 2 or greater) defined by Q modulated phase differences at each time and surviving $M^{Q-1}$ paths each representing a most likelihood path to each of the $M^{Q-1}$ states, the path metric memory being adapted for storing a path metric that represents likelihood of a sequence to each state, the differential phase detecting method comprising the steps of detecting a phase $\Psi_n$ of a received signal at each transmitted symbol interval T corresponding to a local signal at a time point nT, where n is any integer, tracing back a state $S_{n-1}$ of the $M^{Q-1}$ states at a time point (n-1)T along a surviving path stored in the path memory, obtaining a sequence $\{\Delta\phi_{n-1}; i=1, 2, \ldots, L-1\}$ along the surviving path to the last state of a state $S_{n-1}$ and adding a last symbol of a phase difference $\Delta\phi_n$ at the time point nT to the sequence so as to form a candidate sequence $\{\Delta\phi_{n-i}; i=0, 1, 2, \ldots, L-1\}$, where L is a predetermined integer and $L \geq Q$, adding a detected phase $\Psi_{n-q}$ at a time point (n-q)T to the sum of the phase differences of a partial sequence $\{\Delta\phi_{n-i}; i=0, 1, \ldots, q-1\}$ of the candidate sequence so as to obtain an estimated value of the phase $\Psi_n$ and calculating the difference between the estimated value and the phase $\Psi_n$ so as to obtain a phase error $\mu_n(q)$, adding the v-th power value of the absolute value of the phase error $\mu_n(q)$ from q=1 to L so as to obtain the following branch metric $$\lambda(S_{n-1} \to S_n) = |\mu_n(1)|^v + |\mu_n(2)|^v + \ldots + |\mu_n(L)|^v$$

that represents likelihood of M branches from M states out of the $M^{Q-1}$ states $S_{n-1}$ at the time point (n-1)T to one of the $M^{Q-1}$ state $S_n$ at the time point nT. The M branch metrics $\lambda(S_{n-1} \to S_n)$ to each state at the time point nT are added to path metrics $\Lambda(S_{n-1})$ of the state $S_{n-1}$ at the time point (n-1)T that are read from the metric memory so as to obtain path metrics $\Lambda(S_n|S_{n-1})$ of the M candidate sequences that pass through the M states of $S_{n-1}$, and compare the path metrics $\Lambda(S_n|S_{n-1})$ so as to obtain a state $S_{n-1}'$ with the minimum value. This state $S_{n-1}'$ represents a state at the time point (n-1)T of a most likelihood path (i.e. a surviving path) to the state $S_n$ at the time point nT. In this manner, path metrics of surviving paths for all the $M^{Q-1}$ states at the time point nT are obtained and compared to obtain a state $S_n'$ with the minimum value. The path memory is traced back to the state $S_{n-D}$ for a predetermined interval DT starting from the state $S_n'$, outputting, as a decoded symbol, a phase difference $\Delta\phi_{n-D}$ that is one of Q-1 phase differences which construct the state $S_{n-D}$.

A third aspect of the present invention is a differential phase detecting method of an M-phase DPSK modulated signal, comprising the steps of detecting a phase $\Psi_n$ of a received wave at each transmitted symbol interval T with reference to a local signal, obtaining the difference $\Psi_n - \Psi_{n-q}$ between the detected phase $\Psi_n$ and a phase $\Psi_{n-q}$ for each of up to L preceding symbols where $q=1, 2, \ldots, L$, obtaining a sum $\delta_{n-1}(q) = \Sigma \Delta\bar\phi_{n-i}$ (where $\Sigma$ is the summation for i=1 to q-1) of the phase difference $\Delta\bar\phi_{ni}$ decided for each of up to (q-1) preceding symbols and obtaining the v-th power value of the absolute value of the difference $\mu_n(q)$ between the detected phase difference $\Psi_n - \Psi_{n-q}$ and the sum of the added value $\delta_{n-1}(q)$ and each of M candidate phase differences $\Delta\phi_n'$ as a metric of the q-symbol differential phase detection, adding metrics of the L phase differences so as to obtain a branch metric $\lambda n = |\mu_n(1)|^v + \ldots + |\mu_n(L)|^v$ for the candidate phase difference $\Delta\phi_{n'}$, and outputting the candidate phase difference with a minimum branch metric as a determined phase difference $\Delta\bar\phi_n$.

BRIEF DESCRIPTION OF DRAWINGS

FIG. 9 is a table for comparing computation complexities corresponding to the third and fourth embodiments of the present invention and to References 1 and 2 in the case that sequence length N is L;

BEST MODES FOR CARRYING OUT THE INVENTION

First, embodiments of a differential phase detecting method according to the present invention will be described.

(1) First Embodiment

It is assumed that the carrier phase at time point (n-1)T modulated by M-phase DPSK modulation method is denoted by $\phi_{n-1}$. The phase difference representing information to be transmitted at time point nT is denoted by $\Delta\phi_n=2m\pi/M$ (where m=0, 1, ..., M-1). The carrier phase $\phi_n$ at time point nT is given by $\phi_{n-1}+\Delta\phi_n$. An N-symbol phase difference sequence $\{\Delta\phi_n; n=0, 1, ..., N\}$ is transmitted. When an M-phase DPSK signal is received in an interval $(n-1)T\leq t<nT$, it can be expressed as follows:

$$z(t)=(2Es/T)^{1/2}exp\,j\,(\phi_n+\theta)+w(t) \quad (1)$$

where $\phi_n=2m\pi/M$ (where m=0, 1, ..., M-1) is a modulated carrier phase; Es is energy per symbol; T is one symbol length; $\theta$ is the phase difference between the received wave and the output of the local oscillator of the receiver; w(t) is noise of the receiver; and $\Delta\phi_n=\phi_n-\phi_{n-1}$ is the n-th phase difference of information transmitted.

After the received signal z(t) is filtered and the outband noise is removed, a phase difference between the received signal z(t) and the local signal of the local oscillator is detected. The phase difference at time point nT is denoted by $\Psi_n$. The phase difference $\Psi_n$ is given by the following equation:

$$\Psi_n=\phi_n+\eta_n\theta\,mod\,2\pi \quad (2)$$

where $\eta_n$ is phase noise caused by thermal noise; mod $2\pi$ is modulo operation, in which $(x+2\pi)\,mod\,2\pi=x$ (where $|x|\leq\pi$).

Figure 1:
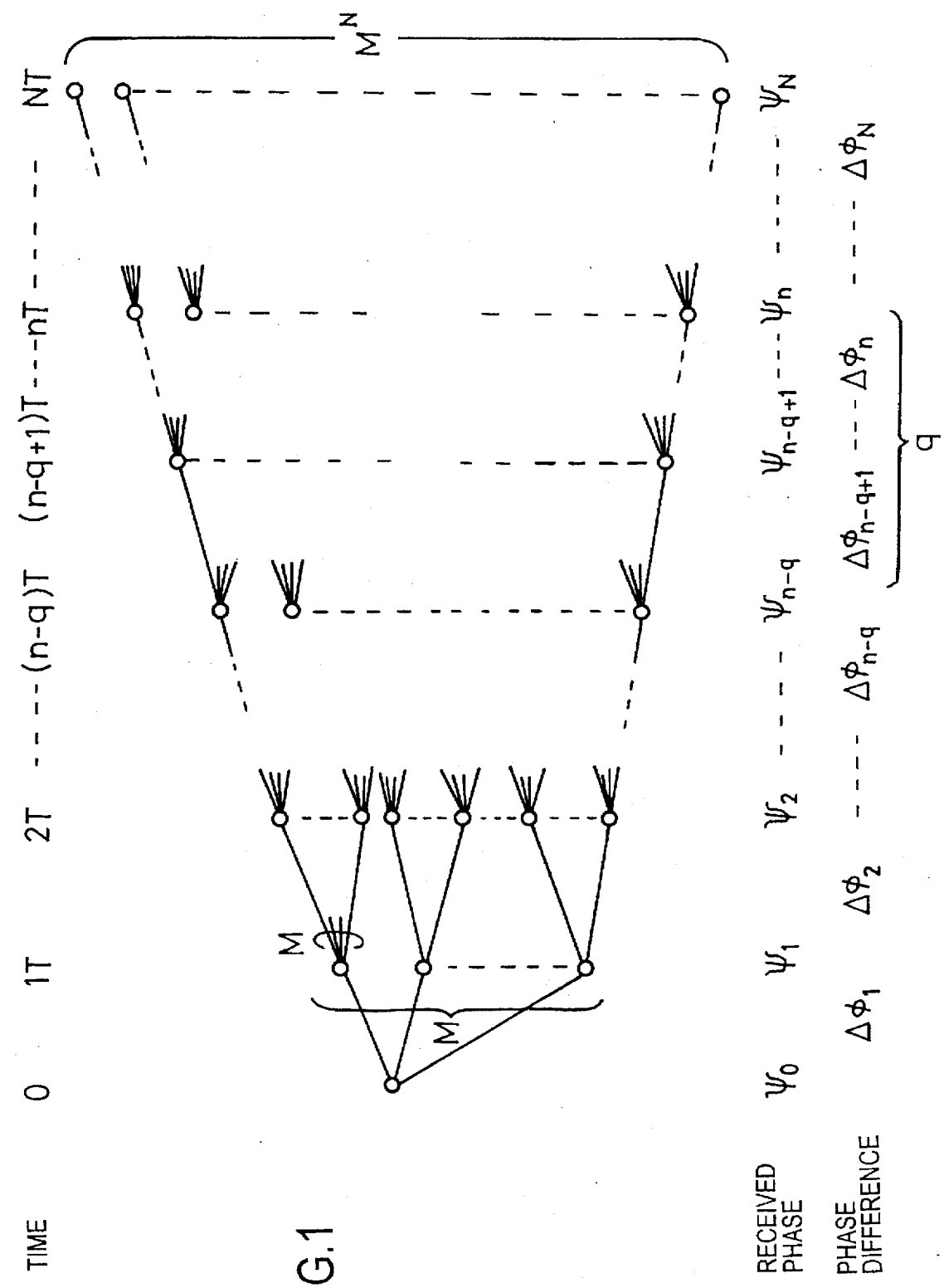
FIG. 1 is a schematic diagram showing state transition of a differential detecting method for explaining a differential phase detecting method according to a first embodiment of the present invention.

Now, as shown in FIG. 1, it is assumed that a phase sequence of (N+1) phases $\Psi_0$ to $\Psi_N$ are obtained at time points 0 to NT, respectively. The transmitted phases of symbols transmitted from the transmitter side are expressed by the following equations:

$$\phi_N = \phi_{N-1}+\Delta\phi_N \quad (3)$$
$$\phi_{N-1} = \phi_{N-2}+\Delta\phi_{N-1}$$
$$\cdot$$
$$\cdot$$
$$\cdot$$
$$\phi_{N-q+1} = \phi_{N-q}+\Delta\phi_{N-q+1}$$
$$\cdot$$
$$\cdot$$
$$\cdot$$
$$\phi_1 = \phi_0+\Delta\phi_1$$

From equations (3), the following equations are satisfied:

$$\phi_N = \phi_{N-q}+\Delta\phi_N+\Delta\phi_{N-1}+...+\Delta\phi_{N-q+1}\,mod\,2\pi \quad (4)$$

$$\phi_N-\phi_{N-q}=\sum_{i=0}^{q-1}\Delta\phi_{N-i}\,mod\,2\pi$$

On the receiver side, the variation $\Delta\Psi_N(q)$ of the phases of the received signals in an interval from $t=(N-q)T$ to NT can be given by the following equations:

$$\Delta\Psi_N(q) = \Psi_N-\Psi_{N-q}\,mod\,2\pi \quad (5)$$

$$=\sum_{i=0}^{q-1}\Delta\phi_{N-i}+\Delta\eta_N(q)\,mod\,2\pi$$

where $\Delta\eta_N(q)=\eta_N-\eta_{N-q}$ is the phase difference noise. At this point, the fixed phase difference $\theta$ between the received signal and the local oscillator of the receiver is removed. Since $\eta_N$ and $\eta_{N-q}$ can be approximated by independent Gaussian noise of average value=0 and variance=$2\sigma^2$, $\Delta\eta_N$ (q) becomes gaussian noise with average value=0 and variance=$2\sigma^2$. When a phase error vector is defined as $\mu=\{\mu_N(1), \mu_N(2), ..., \mu_N(N)\}^T$ (where T is a transposed matrix), the phase noise $\Delta\eta_N$ is expressed as follows:

$$\mu_N(q)=\Delta\Psi_N(q)-\sum_{i=0}^{q-1}\Delta\phi_{N-i}\,mod\,2\pi \quad (6)$$

A joint probability density function P of $\mu$ under the condition that the phase difference sequence $\Delta\phi=(\Delta\phi_1, \Delta\phi_2, ..., \Delta\phi_N)^T$ is transmitted can be given by the following equation:

$$P(\mu|\Delta\phi)=\frac{1}{(2\pi)^{N/2}(detR)^{1/2}}\,exp\left\{-\frac{\mu^TR^{-1}\mu}{2}\right\} \quad (7)$$

where R is N×N covariance matrix of $\Delta\eta=\{\Delta\eta_N(1), \Delta\eta_N(2), ..., \Delta\eta_N(N)\}^T$; and det R and $R^{-1}$ are determinant and inverse of a matrix R, respectively. When M phase differences take place with the same probability (normally this condition is satisfied), the maximum likelihood estimation of the transmitted phase difference sequences is performed by finding the phase difference sequence $\Delta\phi'=(\Delta\phi_1', \Delta\phi_2', ..., \Delta\phi_N')^T$ that maximizes the probability of equation (7). This is equivalent to finding the phase difference sequence $\Delta\phi'$ that minimizes $\mu^TR^{-1}\mu$ as in equation (8):

$$\Delta\phi'=MIN\,\mu^TR^{-1}\mu\,over\,\Delta\phi \quad (8)$$

To find $\Delta\phi'$, it is necessary to obtain R. The phase difference noise is Gaussian noise with the following properties:

$$<\Delta\eta_N(i)> = 0 \quad (9)$$

$$<\Delta\eta_N(i)\Delta\eta_N(j)> = 2\sigma^2\,for\,i=j$$
$$= \sigma^2\,for\,i\neq j$$

where $<x(i)>$ is the statistical expression of x. Thus, R can be given by the following equation:

$$R=(r_{ij})=\sigma^{2N}\begin{bmatrix}2 & 1 & . & . & . & . & . & . & 1\\1 & 2 & & & & & & & .\\. & & . & & & & & & .\\. & & & . & & & & & .\\. & & & & . & & & & .\\. & & & & & . & & & .\\. & & & & & & . & & .\\. & & & & & & 1 & 2 & 1\\1 & . & . & . & . & . & . & 1 & 2\end{bmatrix} \quad (10)$$

When the standard matrix theory is applied, $R^{-1}$ can be given by the following equation:

$$R^{-1}=\sigma^{-2}/(N+1)\begin{bmatrix}N & -1 & . & . & . & . & . & . & -1\\-1 & N & & & & & & & .\\. & & . & & & & & & .\\. & & & . & & & & & .\\. & & & & . & & & & .\\. & & & & & . & & & .\\. & & & & & & . & & .\\. & & & & & & -1 & N & -1\\-1 & . & . & . & . & . & . & -1 & N\end{bmatrix} \quad (11)$$

When $R^{-1}$ is substituted into equation (8), the maximum likelihood estimation is performed by finding a phase difference sequence with the minimum value of the following equation from $M^N$ phase difference sequence candidates as shown in FIG. 1:

$$\Lambda = \sum_{n=1}^{N} \sum_{q=1}^{n} |\mu_n(q)|^2 \qquad (12)$$

A computer simulation shows that even if $|\mu_n(q)|^v$ (where $v$ is a real number that is 1 or greater) instead of $|\mu_n(q)|^2$ is used, a similar result can be obtained. Thus, the present embodiment is arranged to find a phase difference sequence which minimizes the following value:

$$\Lambda = \sum_{n=1}^{N} \sum_{q=1}^{n} |\mu_n(q)|^v \qquad (13)$$

Figure 2:
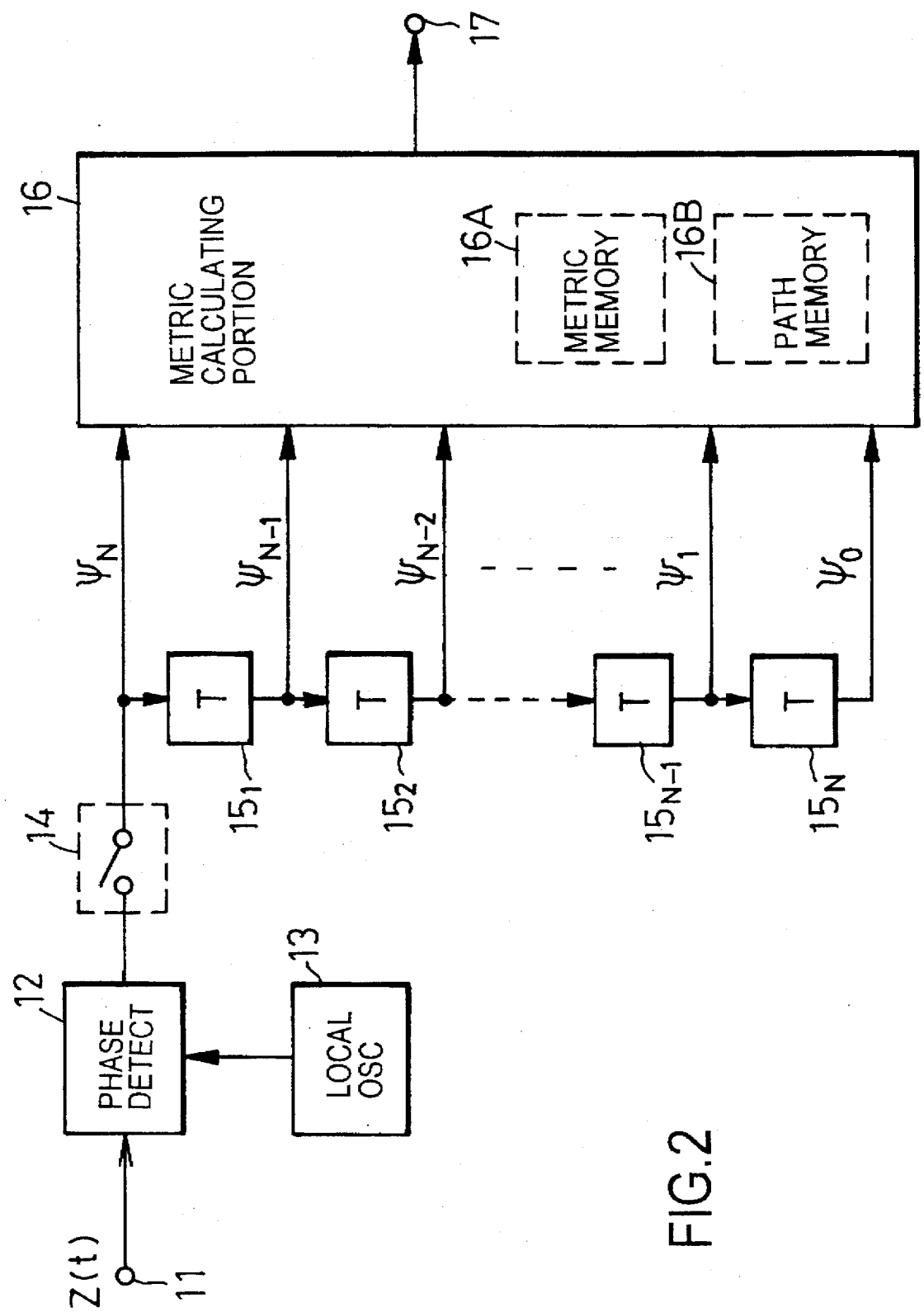
FIG. 2 is a block diagram showing the differential phase detector according to the first embodiment.

FIG. 2 shows a construction of a differential phase detector according to the first embodiment of the present invention.

A received signal is supplied from an input terminal 11. The phase difference between the received signal and the local signal of a local oscillator 13 is detected by a phase detector 12. In the case of a transmitting device for use with present mobile communication, the received phase modulated signal is an intermediate frequency signal having a center frequency at the second intermediate frequency, and is the output signal from a limiter amplifier or an AGC amplifier. The detected output is sampled by a sampling circuit 14 in a predetermined interval (symbol interval T). The sampled signal is input to delay circuits $15_1$ to $15_N$ each of which has a delay of the symbol interval T. Thus, phases $\Psi_n$ (where n=N, N−1, ..., 0) with delays of 0 to N symbols are input to a metric calculating portion 16.

In the first embodiment, whenever a predetermined number N of phases of the received signal z(t) are received in the symbol interval T, the maximum likelihood estimation is performed for a sequence of N phase differences $\Delta\phi_n$ (where n=1 to N). In other words, the metric calculating portion 16 calculates a path metric of a phase difference sequence candidate corresponding to equation (12) and stores the path metric in a metric memory 16A. The metric calculating portions 16 repeats this process for all the candidates (namely, $4^N$ in the case of four-phase DPSK), obtains a phase difference sequence with the minimum path metric, and outputs the result as a decoded output to a terminal 17. In reality, the metric calculating portion 16 adds the sum of partial sequence $\{\Delta\phi_i; i=n+1-q, n+2-q, \ldots, n\}$ of the N-symbol phase difference sequence candidate $\{\Delta\phi_n; n=1, 2, \ldots, N\}$ to a detected phase $\Psi_{n-q}$ at each time point $(n-q)T$ (where $q=1, 2, \ldots, n$) and obtains an estimated value $\Psi_n'$ of a received signal phase $\Psi_n$ according to the following equation:

$$\Psi_n' = \Psi_{n-q} + \Delta\phi_n + \Delta\phi_{n-1} + \ldots + \Delta\phi_{n-q+1} \bmod 2\pi \qquad (14)$$

A difference (estimated error) $\mu_n(q)$ between the estimated value $\Psi_n'$ and the received signal phase $\Psi_n$ is obtained by the following equations from q=1 to n according to equation (6).

$$\mu_n(1) = \Psi_n - (\Psi_{n-1} + \Delta\phi_n) \bmod 2\pi \qquad (15)$$
$$\mu_n(2) = \Psi_n - (\Psi_{n-2} + \Delta\phi_n + \Delta\phi_{n-1}) \bmod 2\pi$$
$$\vdots$$
$$\mu_n(q) = \Psi_n - (\Psi_{n-q} + \Delta\phi_n + \Delta\phi_{n-1} + \ldots + \Delta\phi_{n-q+1}) \bmod 2\pi$$
$$\vdots$$
$$\mu_n(n) = \Psi_n - (\Psi_0 + \Delta\phi_n + \Delta\phi_{n-1} + \ldots + \Delta\phi_1) \bmod 2\pi$$

Next, it is assumed that the v-th power value of the absolute value of each estimated phase error $\mu_n(q)$ is a metric of q-symbol differential phase detection. The summation of the metrics from q=1 to n at a time point nT is given by the following equation:

$$\lambda_n = \sum_{q=1}^{n} |\mu_n(q)|^v \qquad (16)$$

As the most important point of the present invention, the phase difference at any time point nT is estimated not only from the phase $\Psi_{n-1}$ of the just preceding signal, but also from phases $\Psi_{n-2}, \ldots$ of further preceding signals, and thus the bit error rate can be improved using these estimated errors $\mu_n(q)$. As in equation (12), $v$ is theoretically 2. However, simulation results show that $v$ can be any positive real number in the range from 1 to 10. By the summation of the branch metrics from time point 1T to time point NT, the path metric $\Lambda$ of the phase difference sequence candidates $\Delta\phi_1, \Delta\phi_2, \ldots, \Delta\phi_N$ is obtained corresponding to the following equation.

$$\Lambda = \sum_{n=1}^{N} \lambda_n \qquad (17)$$

Path metrics are calculated for all ($M^N$) N-symbol phase difference sequence candidates and then stored in a metric memory 16A. A phase difference sequence candidate with the minimum path metric is defined as a decoded sequence and output from a terminal 17.

(2) Second Embodiment

In the first embodiment, the error rate is improved in proportion to the value of N. However, in the M-phase DPSK system, since there are M phase points, path metrics for all the $M^N$ sequence candidates shown in FIG. 1 should be calculated. Thus, the computation complexity is exponentially proportional to the value of N. In a second embodiment of the present invention, to satisfy the improvement of the error rate and the reduction of the computation complexity, the upper limit of the addition with respect to q in equation (13) is set to L (where L is any integer; $2 \leq L < N$). In addition, the following equation is defined as a branch metric:

$$\lambda_n = \sum_{q=1}^{L} |\mu_n(q)|^v \qquad (18)$$

Figure 3:
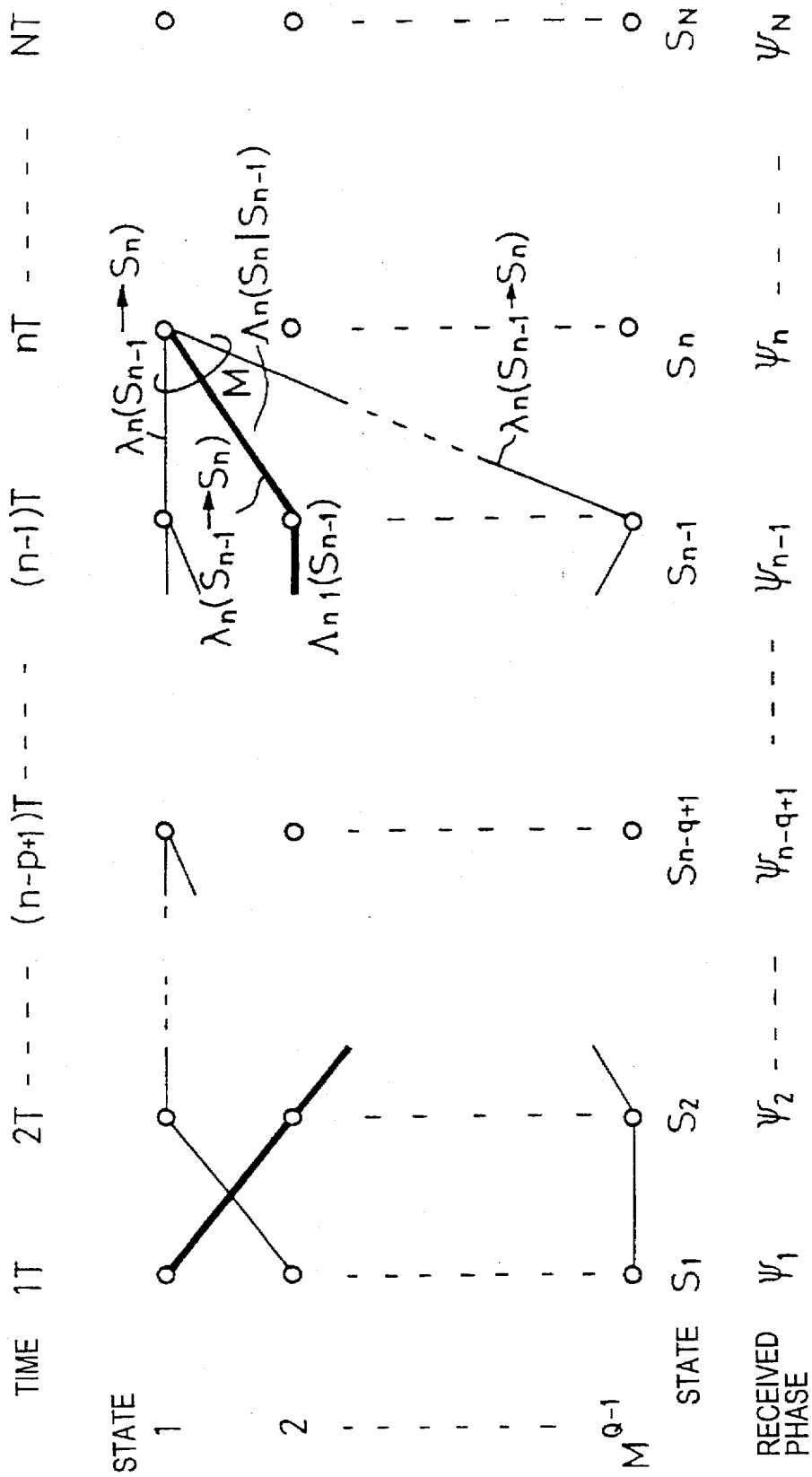
FIG. 3 is a schematic diagram showing state transition of a differential phase detecting method according to a second embodiment of the present invention.

As shown in a state transition of FIG. 3, phase difference sequences are successively estimated using the Viterbi algorithm with $M^{Q-1}$ states. In this case, states $S_n$ at a time point nT are defined by a phase difference sequence $\{\Delta\phi_n, \Delta\phi_{n-1}, \ldots, \Delta\phi_{n-Q+2}\}$ from time point n−Q+2 to time point nT. Since each phase difference has M values, the number of states at each time point is $M^{Q-1}$. The relation between Q and L is $2 \leq Q \leq L$.

The construction of a phase difference detector according to the second embodiment will be described with reference to FIG. 2. In this embodiment, the number of delay circuits 15 connected in series is L rather than N. Next, the process algorithm performed in the metric calculating portion 16 shown in FIG. 2 will be described.

Step S1: When metrics $\lambda_n(S_{n-1} \to S_n)$ of M branches that from $M^{Q-1}$ states $S_{n-1}=(\Delta\phi_{n-(Q-1)}, \ldots, \Delta\phi_{n-2}, \Delta\phi_{n-1})$ at a time point (n−1)T to a state $S_n=(\Delta\phi_{n-(Q-2)}, \ldots, \Delta\phi_{n-1}, \Delta\phi_n)$ at a time point nT are calculated, surviving path to the state $S_{n-1}$ is traced back for a (L−Q) time and a sequence of (L−1) symbols $(\Delta\phi_{n-i}; i=1, 2, \ldots, L-1)$ is obtained. A phase difference $\Delta\phi_n$ at a time point nT that is a last symbol is added to the symbol sequence to obtain an L-symbol sequence and then the metric $\lambda_n(S_{n-1} \to S_n)$ is calculated corresponding to equation (18). The number of states at each time point is $M^{Q-1}$. However, the number of states $S_{n-1}$ at the time point (n−1)T that can be shifted to each state $S_n$ at the immediately succeeding time point nT is M out of $M^{Q-1}$ (where M is the number of phases of the DPSK system).

Step 2: A path metric of M branches to the state $S_n$ is calculated according to the following equation:

$$\Lambda_n(S_n|S_{n-1}) = \Lambda_{n-1}(S_{n-1}) + \lambda_n(S_{n-1} \to S_n) \quad (19)$$

The path with the minimum path metric is a surviving path with the maximum likelihood that arrives at the state $S_n$, and the state from which the transition has been made is stored in the path memory 16B (see FIG. 2). The value of the minimum path metric is defined as a path metric $\Lambda_n(S_n)$ of each state and stored in the metric memory 16A.

Step S3: A path that gives the minimum path metric $\Lambda_n(S_n)$ among $M^{Q-1}$ states $S_n$ is selected as a surviving path and the state transition stored in the path memory 16B is traced back along the selected path for an interval DT. The depth of the trace back may be about 4. Phase difference $\Delta\phi_{n-D}$ of state $(\Delta\phi_{n-(D+Q-2)}, \ldots, \Delta\phi_{n-(D+1)}, \Delta\phi_{n-D})$ traced back is output as a decoded result $\Delta\phi_{n-D}'$.

Figure 4:
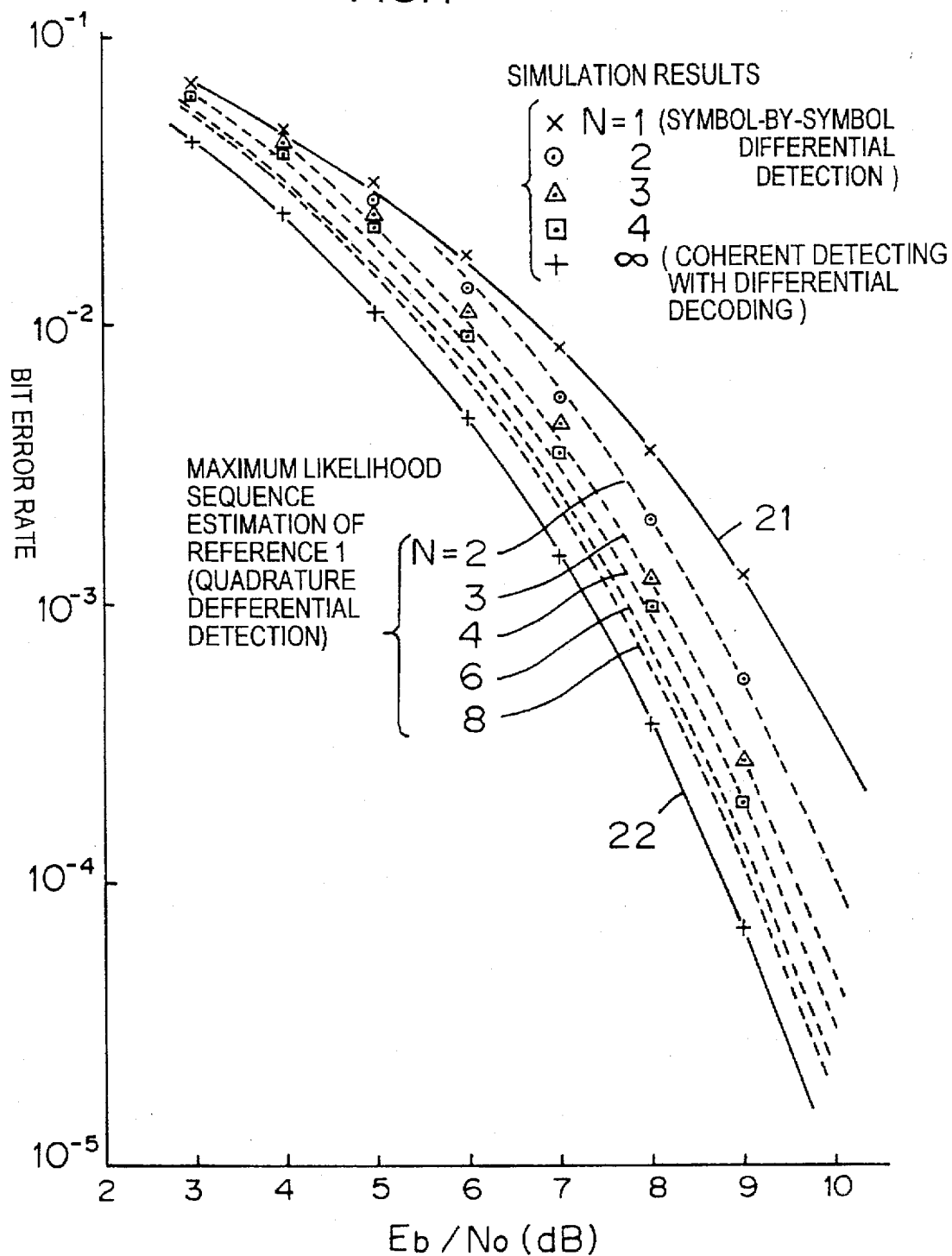
FIG. 4 is a graph showing a bit error rate in a computer simulation according to the first embodiment.

FIG. 4 shows the results of a computer simulation of the error rate characteristics of the differential phase detection according to the first embodiment. In the simulation, v=2. In the graph, the horizontal axis represents bit energy-to-noise ratio (Eb/No). In FIG. 4, the cases of N=2, 3, and 4 are plotted by ○, △, and □, respectively. In addition, for comparison, error rates of conventional symbol-by-symbol differential phase detection (N=1) and coherent detecting with differential decoding are plotted by x and +, respectively. In FIG. 4, solid lines 21 and 22 represent ideal curves. To accomplish the error rate of 0.1%, the difference in Eb/No between symbol-by-symbol differential phase detection and coherent detecting with differential decoding is 1.8 dB. When N=3, the difference in Eb/No can be reduced to 0.9 or less. When N=4, the difference in Eb/No becomes around 0.6 dB. In FIG. 4, the theoretical characteristics (Reference 1) of error rate in the case that the maximum likelihood sequence estimation is performed for the conventional quadrature differentially detected output are denoted by dotted lines. From FIG. 4, it is clear that in the first embodiment, almost the same improvement as Reference 1 can be accomplished.

Figure 5:
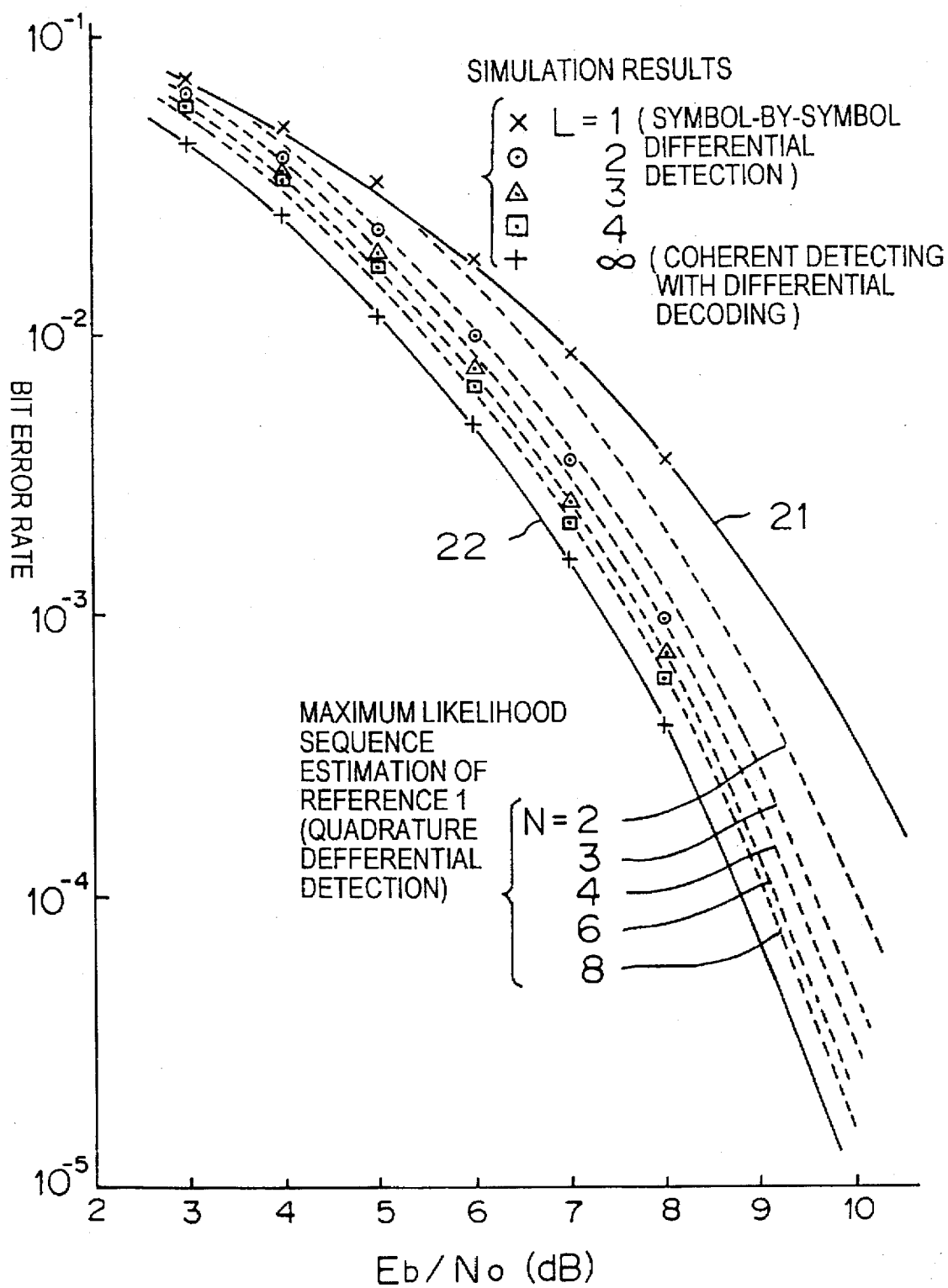
FIG. 5 is a graph showing a bit error rate in a computer simulation according to the second embodiment.

FIG. 5 shows the results of a computer simulation of the error rate characteristics of the differential phase detection method according to the second embodiment. When L=Q=4, the difference in Eb/No between symbol-by-symbol differential phase detection and coherent detecting with differential decoding becomes approximately 0.2 dB.

In the second embodiment, the relation between Q and L is 2≤Q≤L. Next, a third embodiment where Q=2 and Q<L will be described.

(3) Third Embodiment

In the second embodiment, the Viterbi algorithm with $M^{Q-1}$ states (where 2≤Q≤L) was used so as to reduce the computational complexity in comparison with that of the first embodiment. In the third embodiment, a differential phase detection method with lesser computational complexity will be described. As with the second embodiment, in the third embodiment the maximum likelihood sequence estimation is performed based on the Viterbi algorithm. As shown in a state transition diagram (M=4) of FIG. 6, in the third embodiment, the number of states of the Viterbi algorithm is M that is the same as the number of phases of modulation. In other words, in the third embodiment, Q=2. Thus, a state Sn at a time point nT is $\Delta\phi_n$. The phase difference represents the state. Consequently, there are only M surviving paths at each time point. In the second embodiment, the number of survival paths at each time point is $M^{Q-1}$. Next, the construction of the third embodiment will be described with reference to FIG. 2.

First, a phase $\Psi_n$ of a received signal z(t) with respect to a locally oscillated signal is detected by the phase detector 12 at each transmitted symbol interval T. As described above, a detected phase at a time point nT is $\Psi_n = \phi_n + \theta + \eta_n$ where $\eta_n$ is phase noise caused by thermal noise. (L+1) received phase samples $\{\Psi_{n-q}; q=0, 1, \ldots, L\}$ are used for the predetermined value L. As is clear from equation (5), $\Psi_n$ and $\Psi_{n-q}$ have the following relation:

$$\Psi_n = \Psi_{n-q} + \sum_{i=0}^{q-1} \Delta\phi_{n-i} + (\eta_n - \eta_{n-q}) \bmod 2\pi$$

Phase errors $\mu_n(1), \mu_n(2), \mu_n(L)$ between the received phase $\Psi_n$ and the estimated phase $\Psi_n'$ are calculated according to the following equation.

$$\mu_n(q) = \Psi_n - \Psi_{n-q} - \sum_{i=0}^{q-1} \Delta\phi_{n-i} \bmod 2\pi$$

As with equation (18), the sum of the v-th power values of the absolute values of the phase errors are calculated for q=1 to L to obtain a branch metric $\lambda_n$ as expressed by the following equation:

$$\lambda(\Delta\phi_{n-1} \to \Delta\phi_n) = \sum_{q=1}^{L} |\mu_n(q)|^v \quad (22)$$

where v is any real number that is 1 or greater. With the branch metric expressed by equation (22), symbols are decoded using the Viterbi algorithm with M states (that will be described later).

Step S1: To select a most likely one of the paths that arrives at a state $\Delta\phi_n$ at a time point nT from M phase difference states at a time point (n-1)T, a phase difference sequence $\{\Delta\phi_{n-i}; i=1, 2, \ldots, L-1\}$ stored in the path memory 16B is read by tracing back surviving paths up to a past time point (n-L+1)T starting from one state $\Delta\phi_{n-1}$ of M states at a time point (n-1)T. The state $\Delta\phi n$ at the time point nT that is a last state is added to the phase difference sequence. Thus, the phase difference sequence candidate $\{\Delta\phi_{n-i}; i=0, 1, \ldots, L-1\}$ is formed.

Step S2: A detected phase $\Psi_{n-q}$ at a time point (n-q)T is added to the sum of the phase differences of the partial sequence $\{\Delta\phi_{n-i}; i=0, 1, \ldots, q-1\}$ of the phase difference sequence candidate so as to obtain an estimated value $\Psi_n'$ of a phase $\Psi_n$. A phase error $\mu_n(q)$ that is the difference between the estimated value $\Psi_n'$ and the detected phase $\Psi_n$ is obtained for each of q=1 to L according to equation (15).

Step S3: The v-th powers of the absolute values of the L phase errors $\mu_n(q)$ are calculated. The resultant values are added from q=1 to L according to equation (22). Thus, a branch metric $\lambda(\Delta\phi_{n-1} \to \Delta\phi_n)$ that represents likelihood of transition from the state $\Delta\phi_{n-1}$ at the time point (n-1)T to the state $\Delta\phi_n$ at the time point nT is obtained. Next, as in the following equation, the branch metric is added to the path metric $\Lambda(\Delta\phi_{n-1})$ of the state $\Delta\phi_{n-1}$ at the time point (n-1)T stored in the metric memory 16A so as to obtain a path metric $\Lambda(\Delta\phi_n|\Delta\phi_{n-1})$ of a candidate sequence that passes through the state $\Delta\phi_{n-1}$.

$$\Lambda(\Delta\phi_n|\Delta\phi_{n-1}) = \Lambda(\Delta\phi_{n-1}) + \lambda(\Delta\phi_{n-1} \to \Delta\phi_n) \quad (23)$$

Step S4: The above-described calculations are performed for each of the M states $\Delta\phi_{n-1}$ at the time point (n-1)T so as to obtain path metrics for the M candidate sequences leading to the state $\Delta\phi_n$. By comparing the path metrics, a state $\Delta\phi_{n-1}'$ with the minimum value is obtained. The state $\Delta\phi_{n-1}'$ that is decided as a state at the time point (n-1)T on the most likely path to the state $\Delta\phi_n$ at the time point nT is stored in the path memory 16B. The path metric $\Lambda(\Delta\phi_n|\Delta\phi_{n-1}')$ is decided as a path metric $\Lambda(\Delta\phi_n)$ of the state $\Delta\phi_n$ at the time point nT and is stored in the metric memory 16A.

Step S5: The processes and calculations at the steps S1 to S4 are repeated for all M states $\Delta\phi_n$ at the time point nT so as to obtain M path metrics. By comparing the M path metrics, a state $\Delta\phi_n'$ with the minimum value is obtained. The path memory is traced back for a predetermined interval DT starting from the state $\Delta\phi_n'$ and the obtained state $\Delta\phi_{n-D}$ is output as a decoded symbol.

Figure 6:
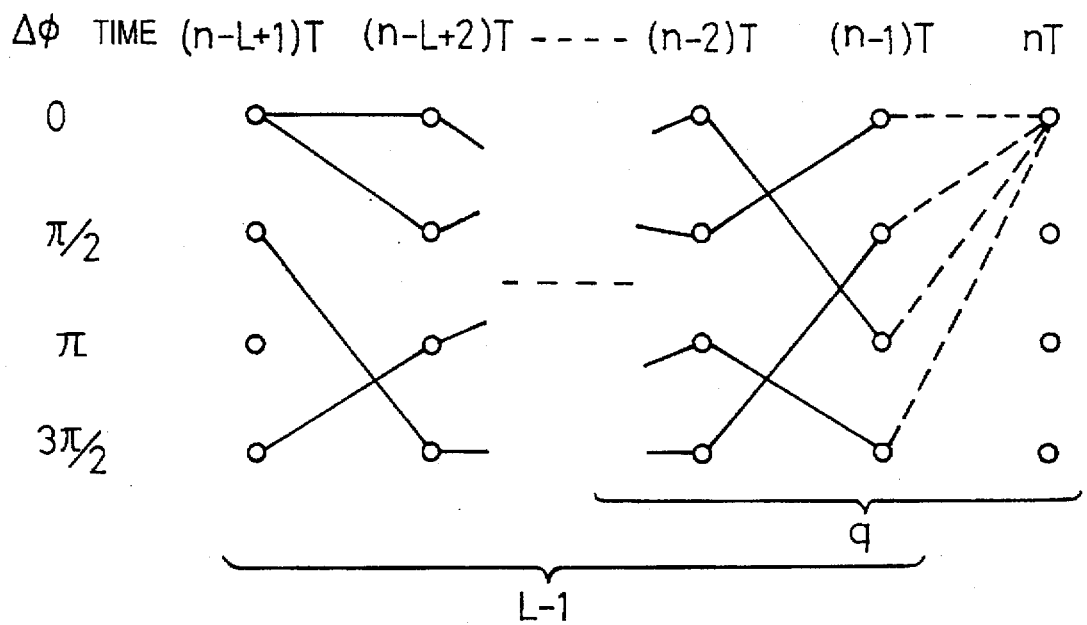
FIG. 6 is a schematic diagram showing state transition for explaining a differential phase detecting method according to a third embodiment of the present invention.

FIG. 6 shows an example of a state transition diagram in the case of M=4 according to the third embodiment. In this example, the maximum likelihood path to the state $\Delta\phi_n=0$ at the time point nT is selected. Referring to FIG. 6, paths denoted by dotted lines extend from four states $\Delta\phi_{n-1}=0$, $\pi/2$, $\pi$, and $3\pi/2$ at the time point (n−1)T to $\Delta\phi_n=0$. Surviving paths denoted by solid lines extend to each state at the time point (n−1)T. For example, in the calculation for the path metric including a transition branch from one state $\Delta\phi_{n-1}=\pi/2$ at the time point (n−1)T to one state $\Delta\phi_n=0$ at the time point nT, the state is traced back for (L−1) states along a surviving path (stored in the path memory 16B) that extends to the state $\Delta\phi_{n-1}=\pi/2$ at the time point (n−1)T. Thereafter, a branch metric $\lambda(\Delta\phi_{n-1}\rightarrow\Delta\phi_n)$ is calculated according to equations (15) and (22). The branch metric is added to the path metric $\Lambda(\Delta\phi_{n-1})$ of the state $\Delta\phi_{n-1}=\pi/2$ at the time point (n−1)T stored in the metric memory 16A so as to obtain a path metric $\Lambda(\Delta\phi_n|\Delta\phi_{n-1})$ of the candidate sequence. Such a process is repeated for the M states $\Delta\phi_{n-1}$ at the time point (n−1)T so as to obtain respective path metrics. By comparing the M path metrics, the maximum likelihood path to the state $\Delta\phi_n$ at the time nT is selected.

Figure 7:
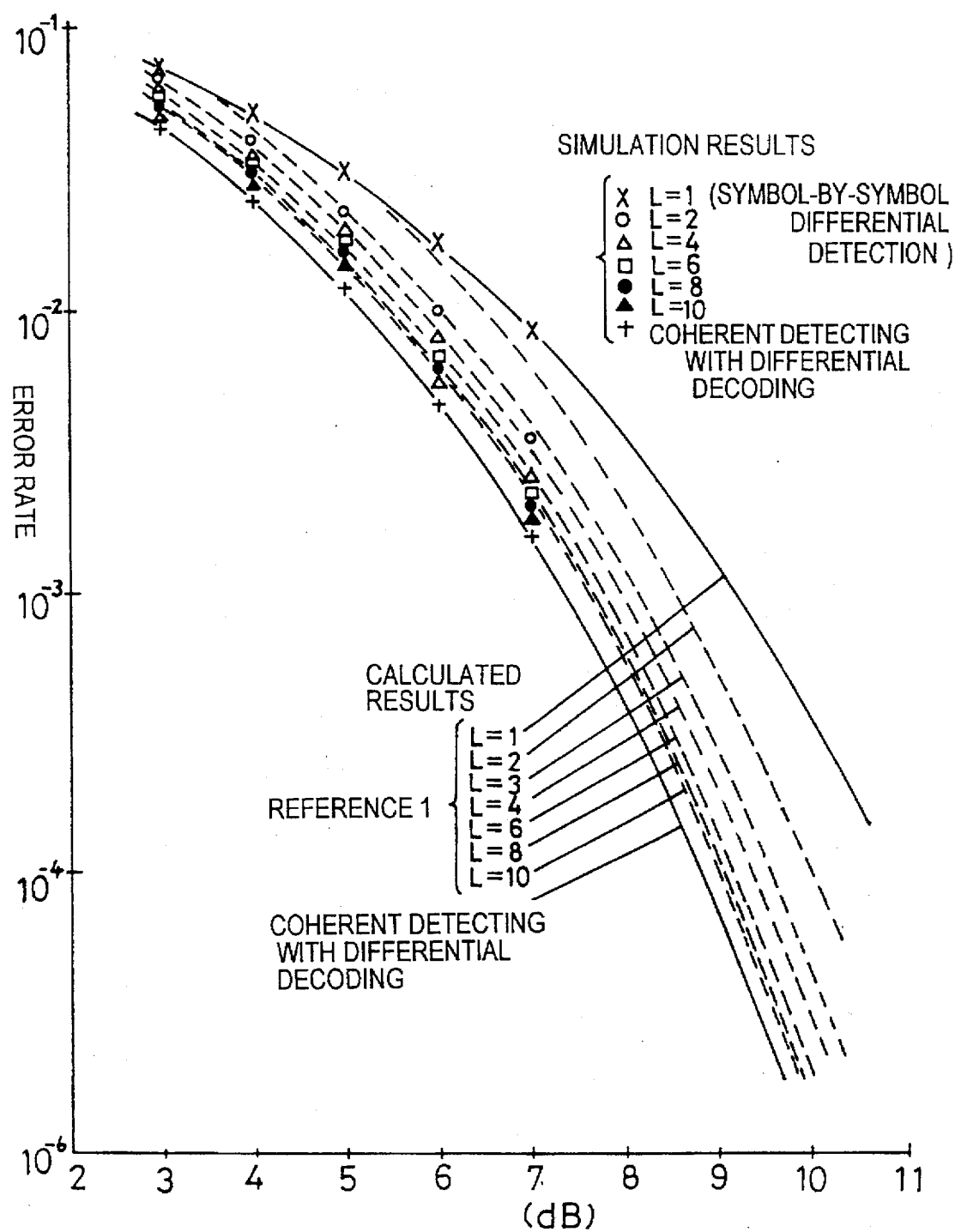
FIG. 7 is a graph showing a bit error rate in a computer simulation according to the third embodiment.

Pig. 7 is a graph showing the results of a computer simulation of error rate performances of the four-phase DPSK method according to the third embodiment. In this simulation, v=2. In the graph, the horizontal axis represents the ratio of signal energy and noise power density per bit (Eb/No) and the vertical axis represents the error rate. For comparison, in FIG. 7, simulation results of error rates of conventional symbol-by-symbol differential phase detection (L=1) and coherent detecting with differential decoding are plotted. In the graph, solid lines represent theoretical curves. The difference in Eb/No between symbol-by-symbol differential phase detection and coherent detecting with differential decoding at the error rate of 0.1% is 1.8 dB. However, when L=2, the difference in Eb/No is the half or less of 1.8 dB. In FIG. 7, theoretical performance curves of the error rate of the maximum likelihood sequence estimation of Reference 1 are plotted with dotted lines. When L=2 and 4, performances equivalent to L=3 and 5 in Reference 1 are accomplished, respectively. As the value of L increases, performance close to Reference 1 is accomplished.

Thus, in the case of performing the most likelihood sequence estimation through the Viterbi algorithm, when the number of states of the Viterbi decoder is equal to the number of phase of the modulation, the computational complexity can be remarkably reduced in comparison with that of Reference 1.

(4) Fourth Embodiment

Figure 8:
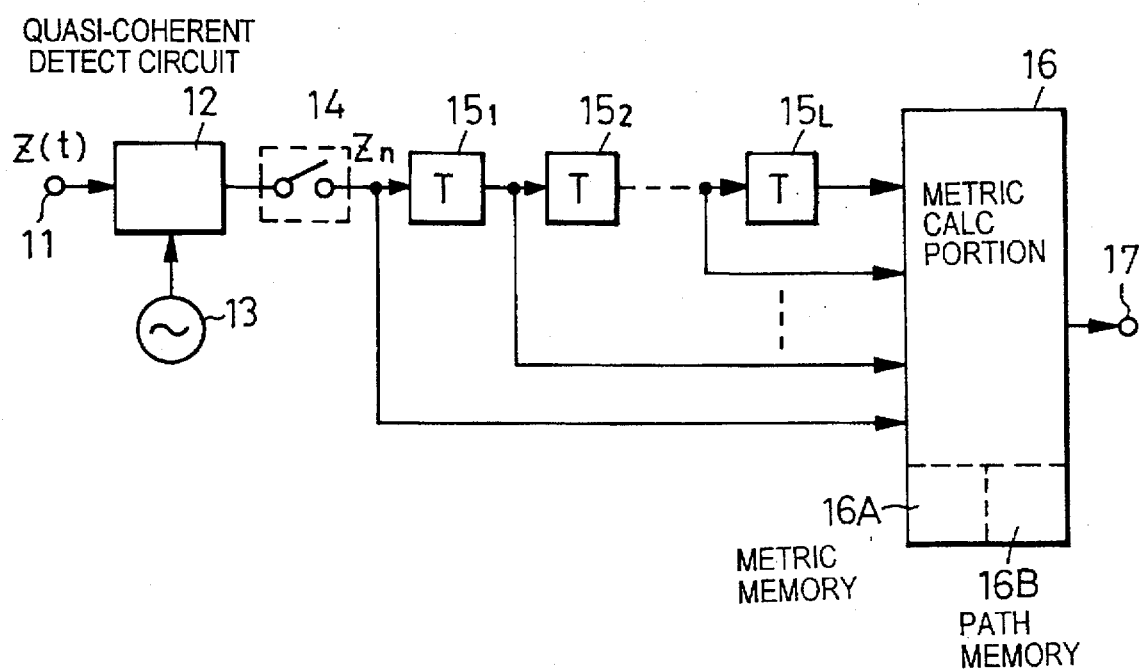
FIG. 8 is a block diagram showing a quadrature differential detector according to a fourth embodiment of the present invention.

In the third embodiment, the phase difference between the received signal z(t) and the locally oscillated signal of the local oscillator 13 is detected by the phase detector 12 so as to perform the Viterbi decoding with the M states. However, as with the third embodiment, the Viterbi decoding with M states can be performed for a sample sequence of a complex detection output of a quasi-coherent detection for the received signal z(t). This method will be described as a fourth embodiment of the present invention. FIG. 8 is a block diagram showing the construction of a quadrature differential detector according to the fourth embodiment.

A received signal z(t) is supplied from an input terminal 11 to a quasi-coherent detecting circuit 12. The quasi-coherent detecting circuit 12 performs quasi-coherent detection for the input signal with two locally oscillated signals supplied from a local oscillator 13. The frequency of the input signal is nearly the same as that of the locally oscillated signals. The locally oscillated signals are 90 deg. apart in phase. The complex output of the quasi-coherent detecting circuit is supplied to a sampling circuit 14. The sampling circuit 14 samples the complex signal in a predetermined interval (symbol interval T) and outputs a complex sample $Z_n$ of the received signal. The complex sample $Z_n$ is input to delay circuits $15_1$ to $15_L$ that are connected in series and each of which causes delay of a symbol period T. The delay circuits $15_1$ to $15_L$ output samples with delays of 1 to L symbols $\{Z_{n-q}; q=1, 2, \ldots, L\}$. The delayed samples and non-delayed samples $Z_n$ are input to a metric calculating portion 16. The metric calculating portion 15 has a metric memory 16A and a path memory 16B. The metric calculating portion 16 performs calculations corresponding to a decoding algorithm similar to that in the third embodiment. The decoding algorithm will be described in the following. Decoded output data is obtained from a terminal 17.

Step S1: To select a most likely one of the paths arriving at a state $\Delta\phi_n$ at a time point nT from M phase difference states at a time point (n−1)T, a surviving path stored in the path memory 16B is traced back to a past time point (n−L+1) starting from a state $\Delta\phi_{n-1}$ of M states at the time point (n−1)T so as to read a phase difference sequence $\{\Delta\phi_{n-i}; i=1, 2, \ldots, L-1\}$. The state $\Delta\phi_n$ at the time point nT as the last state is added to the phase difference sequence so as to form a phase difference sequence candidate $\{\Delta\phi_{n-i}; i=0, 1, \ldots, L-1\}$.

Step S2: The phase of the received signal sample $Z_{n-q}$ is rotated through the sum of the partial sequence $\{\Delta\phi_{n-i}; i=0, 1, \ldots, q-1\}$ of the sequence candidate. This process is repeated from q=1 to L. The L obtained values are added so as to obtain an estimated value $z_n'$ of the received signal sample $z_n$.

Step S3: As expressed in equation (04), a real value of the inner product of the received signal sample $z_n$ and the estimated value $z_n'$ is defined as a branch metric $\lambda(\Delta\phi_{n-1}\rightarrow\Delta\phi_n)$ that represents the likelihood of the transition from the state $\Delta\phi_{n-1}$ at the time point (n−1)T to the state $\Delta\phi_n$ at the time point nT. The branch metric is added to a path metric $\Lambda(\Delta\phi_{n-1})$ of the state $\Delta\phi_{n-1}$ at the time point (n−1)T as in equation (23) so as to obtain a path metric $\Lambda(\Delta\phi_n|\Delta\phi_{n-1})$ of a candidate sequence that passes through the state $\Delta\phi_{n-1}$.

Step S4: The above-described calculations are repeated for the M states $\Delta\phi_{n-1}$ at the time point (n−1)T so as to obtain path metrics for the M candidate sequences. By comparing the path metrics, a state $\Delta\phi_{n-1}'$ with the maximum value is obtained. The state $\Delta\phi_{n-1}'$ is decided as a state at the time point (n−1)T of the most likely path to the state $\Delta\phi_n$ at the time nT and stored in the path memory 16B. The path metric $\Lambda(\Delta\phi_n|\Delta\phi_{n-1}')$ is defined as a path metric $\Lambda(\Delta\phi_n)$ of the state $\Delta\phi_n$ at the time point nT and stored in the metric memory 16A.

Step S5: The processes and calculations at the steps S1 to S4 are repeated for all M states $\Delta\phi_n$ at the time point nT so as to obtain M path metrics. By comparing the M path metrics, the state $\Delta\phi_n'$ with the maximum value is obtained.

The path memory is traced back for a predetermined interval DT starting from the state $\Delta\phi_n{}'$ and the obtained state $\Delta\bar{\phi}_{n-D}$ is output as a decoded symbol.

In quadrature differential detecting based on the Viterbi decoding described in Reference 2, there are $M^{L-1}$ survival paths at each time point. However, in the methods according to the third and fourth embodiments of the present invention, since there are only M survival paths, the error rates thereof are slightly inferior to that of Reference 2. However, in these embodiments, the calculating amount of the branch metrics at each time point is only $M^2$. Thus, the computational complexity in the third and fourth embodiments is much smaller than that of Reference 2. FIG. 9 shows the number of calculations of the branch metrics at each time point in the case of M=4. According to the results of the simulation of the method proposed in Reference 2, when the Viterbi algorithm with $M^{L-1}$ states is used, the error rate performance equivalent to 2L in Reference 1 can be accomplished. The number of calculations of the branch metrics for obtaining the error rate performance equivalent to the case of L=6 in Reference 1 is compared among the methods of References 1 and 2 and the present invention. The number of branch metric calculations in Reference 1 is 683; the number of calculations in Reference 2 is 4096; and the number of calculations in the present invention is 16. Thus, it is clear that the number of calculations in the present invention can be remarkably reduced in comparison with that of the conventional methods.

(5) Fifth Embodiment

In the third and fourth embodiments, the Viterbi algorithm is used. Thus, one most likely path leading to each of a predetermined number of states at each time point from the just preceding time point is selected. Symbol corresponding to states at a time point traced back for a predetermined interval along the most likely path selected among them are output as a decoded result. Thus, the decoded result has a delay against a received phase sample for the predetermined number of symbols. As a maximum likelihood decoding method that is free of such a delay, a decision feedback decoding algorithm that does not use the Viterbi algorithm is known. In the decision feedback decoding algorithm, there is only one surviving path at each time point. Based on the single path of a sequence that has been determined, the next state transition is determined. The decision result is immediately output. Next, the decision feedback decoding method will be described as a fifth embodiment of the present invention.

Figure 10:
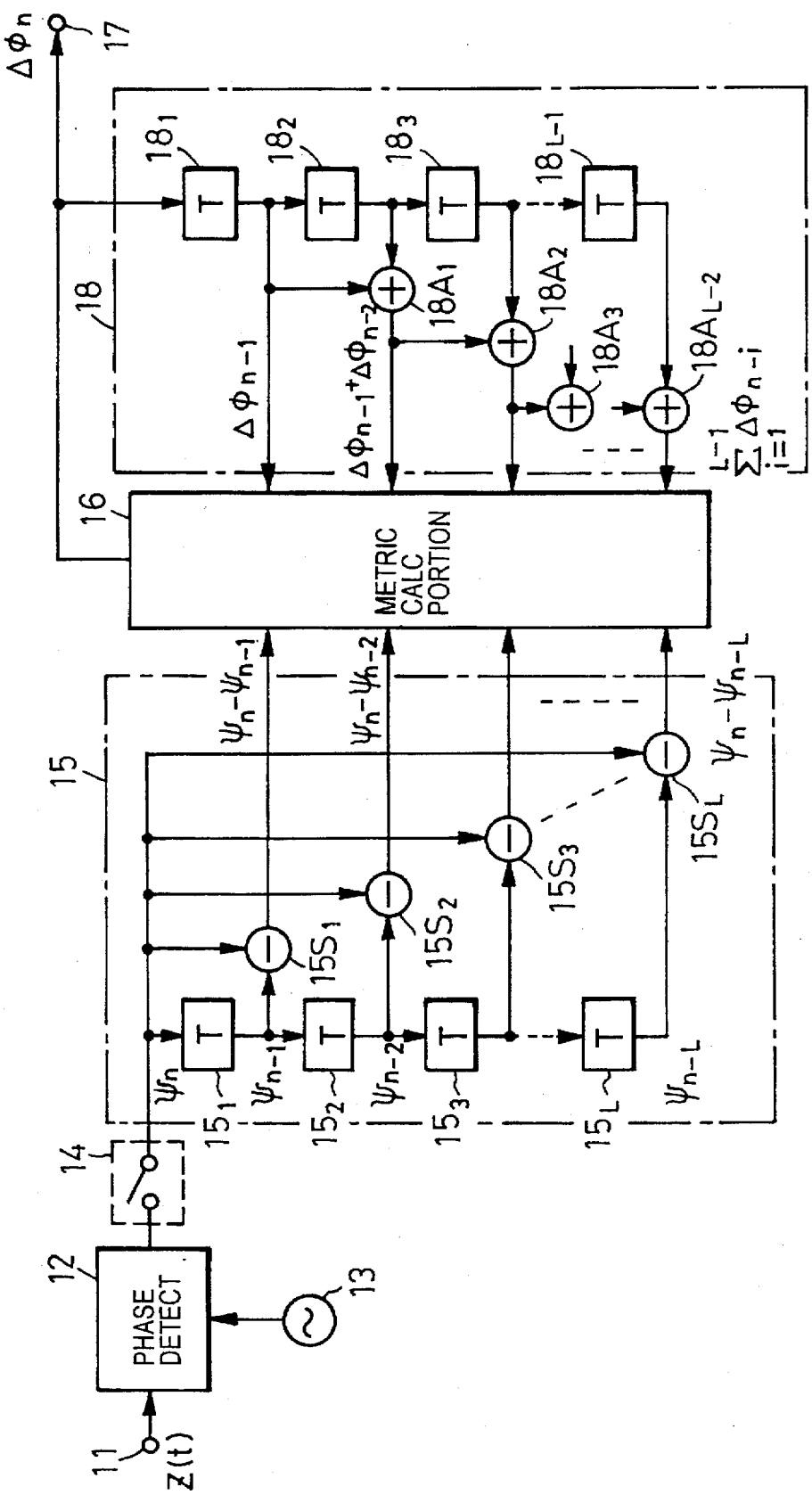
FIG. 10 is a block diagram showing a differential phase detector according to a fifth embodiment of the present invention.

FIG. 10 is a block diagram showing the construction of a differential phase detecting circuit according to the fifth embodiment of the present invention. A phase modulated signal z(t) is received from an input terminal 11. The phase modulated signal z(t) is supplied to a phase detector 12. The phase $\Psi(t)$ of the phase modulated signal z(t) is detected with reference to the phase of a locally oscillated signal of a local oscillator 13. An output of the phase detector 12 is supplied to a sampling circuit 14. The sampling circuit 14 samples the input signal at each symbol interval T and outputs a phase sample $\Psi_n$ of the received signal to a differential phase detecting portion 15. In the differential phase detecting portion 15, the detected phase $\Psi_n$ of each symbol is supplied to L delay circuits $15_1, 15_2, \ldots, 15_n$ each of which has a delay of one symbol interval T. The differences $\Psi_n-\Psi_{n-1}, \Psi_n-\Psi_{n-2}, \ldots, \Psi_n-\Psi_{n-L}$ between the delay outputs $\Psi_{n-1}, \Psi_{n-2}, \ldots, \Psi_{n-L}$ of the delay circuits $15_1, 15_2, \ldots, 15_L$ and the input detected phase $\Psi_n$ are obtained by subtracting circuits $15S_1, 15S_2, \ldots, 15S_L$. The phase differences accord with those expressed by equation (5). The phase differences are supplied to a metric calculating portion 16.

The metric calculating portion 16 decides on the phase difference $\Delta\bar{\phi}_n$ corresponding to a calculating process as will be described later and outputs it to an output terminal 17. In addition, the decided phase difference $\Delta\bar{\phi}_n$ is supplied to a cumulating portion 18. In the cumulating portion 18, the decided phase difference $\Delta\bar{\phi}_n$ is input to (L−1) delay circuits $18_1, 18_2, \ldots, 18_{L-1}$, each of which is connected in series and has a delay of T. The delay circuits $18_1, 18_2, \ldots, 18_{L-1}$ supply delay outputs $\Delta\bar{\phi}_{n-1}, \Delta\bar{\phi}_{n-2}, \ldots, \Delta\bar{\phi}_{n-L+1}$ to adding circuits $18A_1, 18A_2, 18A_3, \ldots, 18A_{L-2}$, respectively. Outputs of the adding circuits $18A_1, 18A_2, \ldots, 18A_{L-2}$ are successively supplied to next-stage adding circuits $18A_2, 18A_3, \ldots, 18A_{L-2}$. Outputs of the adding circuits $18A_1$ to $18A_{L-2}$ are supplied to the metric calculating portion 16. In other words, $\delta_{n-1}(q) = \Sigma \Delta\bar{\phi}_{n-i}$ (where $\Sigma$ is the summation from i=1 to q, and q assumes from 1 to L−1) is supplied to the metric calculating portion 16. The metric calculating portion 16 selects one candidate from M candidate phase differences $\Delta\phi_n{}'$ (in the case of four-phase DPSK system, 0, $\pi/2$, $\pi$, and $3\pi/2$) and adds the selected one to each added value $\delta_{n-1}(q)$ supplied from the cumulating portion 18. The V-th power value of the absolute value of each difference $\mu_n(q)$ (corresponding to equation (6)) between the sum $\delta_{n-1}(q) + \Delta\phi_n{}'$ and the detected phase difference $(\Psi_n-\Psi_q)$ is obtained as follows:

$$|\mu_n(1)|^v = |\Psi_n - \Psi_{n-1} - \Delta\phi_n{}'|^v \quad (24)$$
$$|\mu_n(2)|^v = |\Psi_n - \Psi_{n-2} - (\Delta\phi_n{}' + \Delta\bar{\phi}_{n-1}) \bmod 2\pi|^v$$
$$|\mu_n(3)|^v = |\Psi_n - \Psi_{n-3} - (\Delta\phi_n{}' + \Delta\bar{\phi}_{n-1} + \Delta\bar{\phi}_{n-2}) \bmod 2\pi|^v$$
$$|\mu_n(L)|^v = |\Psi_n - \Psi_{n-L} - (\Delta\phi_n{}' + \Delta\bar{\phi}_{n-1} + \ldots + \Delta\bar{\phi}_{n-L+1}) \bmod 2\pi|^v$$

where v is a real number that is 1 or greater. The sum $\lambda_n = \Sigma|\mu_n(q)|^v$ of $|\mu_n(1)|^v$ to $|\mu_n(L)|^v$ is defined as the branch metric of the candidate phase difference $\Delta\phi_n{}'$. For all M phase difference candidates $\Delta\phi_n{}'$, their branch metrics are calculated and the candidate phase difference $\Delta\phi_n{}'$ with a minimum branch metric is output as the detected phase difference $\Delta\bar{\phi}_n$.

Figure 11:
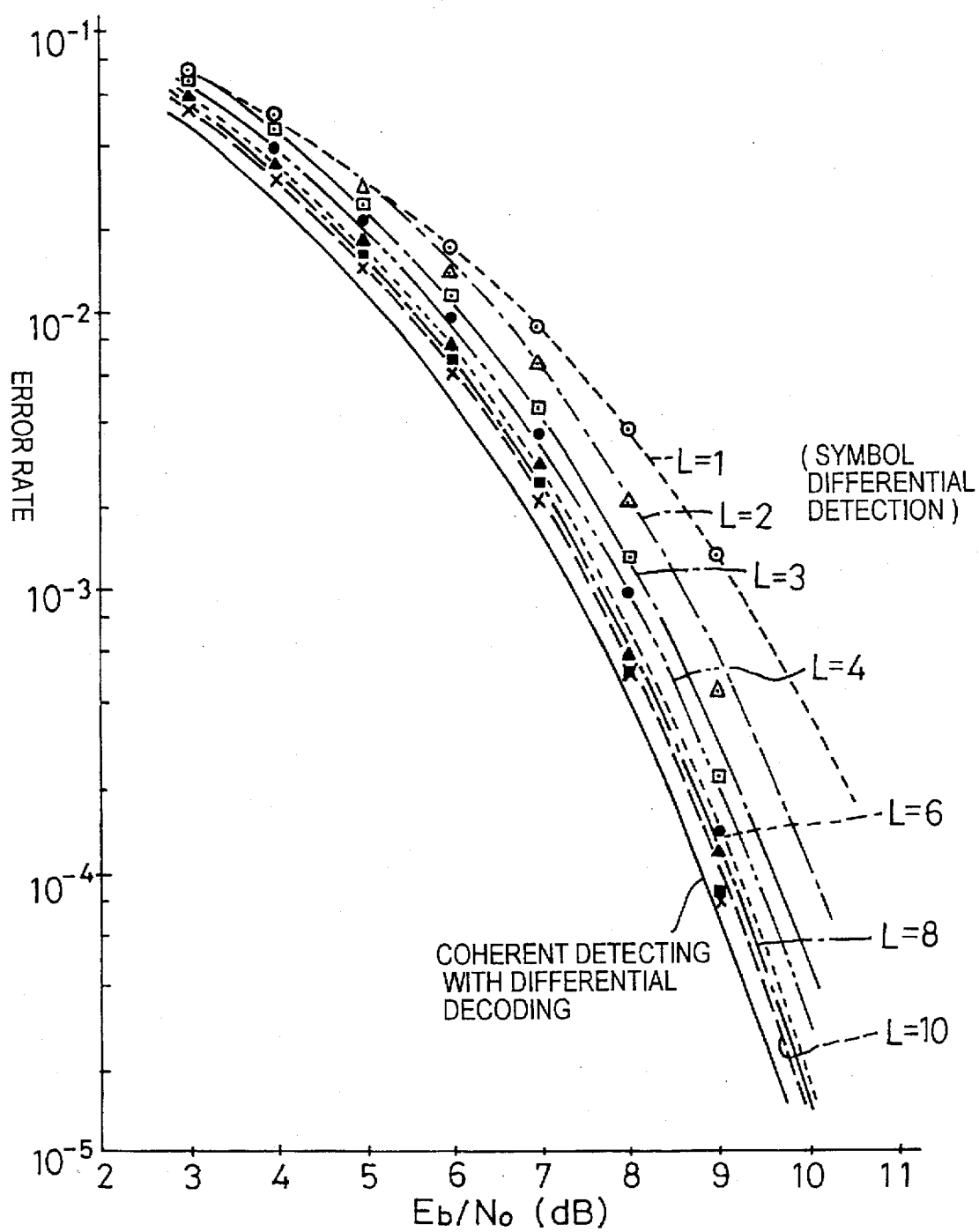
FIG. 11 is a graph showing bit error rate in a computer simulation according to the fifth embodiment.

FIG. 11 is a graph showing results of a computer simulation of error rate performance of four-phase DPSK system according to the fifth embodiment. In this simulation, v=1. In the graph, the horizontal axis represents bit energy-to-noise ratio (Eb/No). In FIG. 11, the performance in the case of L=1 is the same as that of conventional symbol-by-symbol differential detection. In FIG. 11, for comparison, the error rate performance of coherent detecting and differential detection is shown. The difference in Eb/No between symbol-by-symbol differential phase detection and coherent detecting with differential decoding at the error rate of 0.1% is 1.8 dB. When L=3, the difference in Eb/No can be reduced to almost the half of 1.8 dB. When L =10, the difference in Eb/No becomes 0.2 dB.

(6) Sixth and Seventh Embodiments

In the third and fourth embodiments, the number of states of the Viterbi decoding algorithm is reduced to M (in other words, the number of calculations of the branch metrics is reduced). In addition, states are traced back for L−2 along surviving paths leading to each state $\Delta\phi_{n-1}$ at the time point (n−1)T so as to obtain phase difference sequence from $\Delta\phi_{n-2}$ to $\Delta\phi_{n-L+1}$. Branch metrics are calculated using the state $\Delta\phi_n$ at the time point nT and past (L−1) states and a maximum likelihood sequence estimation is applied based on the Viterbi algorithm. Thus, the error rate is improved. In sixth and seventh embodiments according to the present invention, branch metrics can be calculated based on a plurality of past phase states without need to perform the trace-back process at each time point. Thus, in the sixth and seventh embodiments, the number of calculations can be more reduced than that of the third and fourth embodiments.

Equation (02), which expresses a path metric in the maximum likelihood sequence estimation for the above-described quadrature differential detection is modified as follows:

$$\Lambda = \sum_{n=1}^{N} Re\left[ z_n \left\{ \sum_{q=1}^{n} z_{n-q} \exp j(\Delta\phi_{n-1} + \ldots + \Delta\phi_{n-q+1}) \right\} * \exp - j\Delta\phi_n \right] \quad (25)$$

The portion in brackets { } of equation (25) is defined as a reference signal $h_{n-1}$ for calculating a branch metric. The reference signal $h_{n-1}$ is given by the following equation:

$$h_{n-1} = \sum_{q=1}^{n} z_{n-q} \exp j(\Delta\phi_{n-1} + \ldots + \Delta\phi_{n-q+1}) \quad (26)$$

Thus, the branch metric $\lambda$ of equation (04) can be given by the following equation:

$$\lambda = Re[z_n h^*_{n-1} \exp - j\Delta\phi_n] \quad (27)$$

According to equation (26), the reference signal $h_{n-1}$ is the sum of samples from time point (n−1)T to 0. When a forgetting factor $\beta (0 \leq \beta \leq 1)$ is used in equation (26) so as to make the contribution of past samples to $h_{n-1}$ to be in proportion to time, the following equation is obtained:

$$h_{n-1} = \sum_{q=1}^{n} \beta^{q-1} z_{n-q} \exp j(\Delta\phi_{n-1} + \ldots + \Delta\phi_{n-q+1}) \quad (28)$$

The phase difference partial sequence in the bracket ( ) of equation (28) is traced back from time point (n−1)T. Thus, the phase difference in the case of q=1 is 0. Consequently, in the region of q>n+1 (that is, before time 0), if $z_{n-q}=0$, equation (28) can be given by the following recursive expression:

$$\begin{aligned} h_{n-1} &= z_{n-1} + \sum_{q=2}^{\infty} \beta^{q-1} z_{n-q} \exp j(\Delta\phi_{n-1} + \ldots + \Delta\phi_{n-q+1}) \\ &= z_{n-1} + \beta h_{n-2} \exp j\Delta\phi_{n-1} \end{aligned} \quad (29)$$

In equation (27), the branch metric for the state transition from the state $\Delta\phi_{n-1}$ to the state $\Delta\phi_n$ is given by the following equation:

$$\lambda(\Delta\phi_{n-1} \to \Delta\phi_n) = Re[z_n h^*_{n-1}(\Delta\phi_{n-1}) \exp - j\Delta\phi_n] \quad (30)$$

where $h_{n-1}(\Delta\phi_{n-1})$ is the value of $h_{n-1}$ for a state $\Delta\phi_{n-1}$ at a time point (n−1)T. Using a reference signal $h_{n-2}(\Delta\phi_{n-2})$ for a state $\Delta\phi_{n-2}$ at a time point (n−2)T of a surviving path to a state $\Delta\phi_{n-1}$ at a time point (n−1)T, a reference signal $h_{n-1}(\Delta\phi_{n-1})$ for a state $\Delta\phi_{n-1}$ can be calculated in the recursive manner. Thus, unlike with the third and fourth embodiments, in the sixth and seventh embodiments it is not necessary to trace back a survival path to the state $\Delta\phi_{n-1}$ so as to calculate the reference signal $h_{n-1}$ according to equation (26). In addition, in the sixth and seventh embodiments, the delay circuit used in the third and fourth embodiments is omitted. Next, a decoding algorithm corresponding to the sixth and seventh embodiments will be described.

Figure 12:
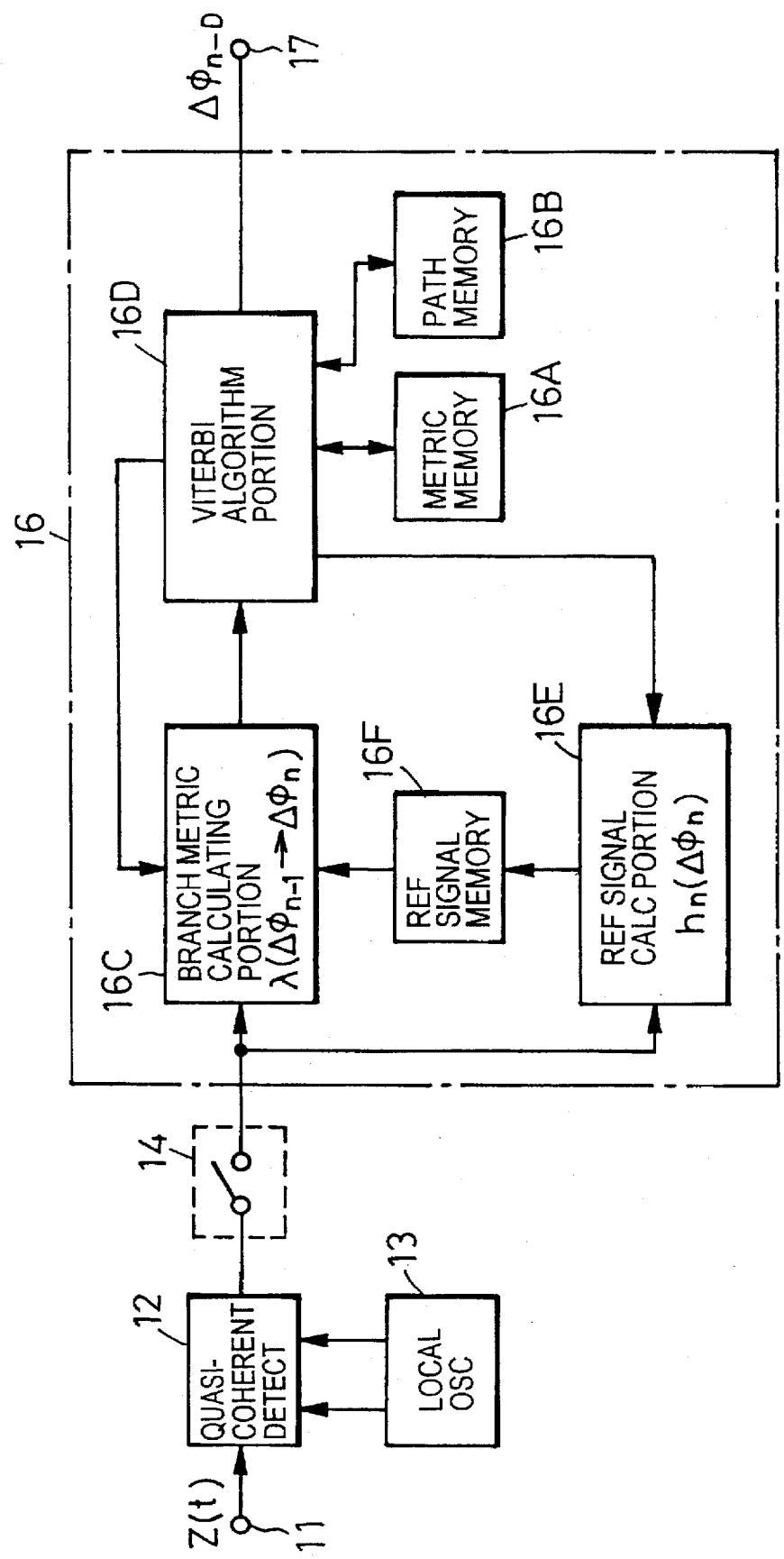
FIG. 12 is a block diagram showing a quadrature differential detector according to a sixth embodiment of the present invention.

FIG. 12 is a block diagram showing the construction of a quadrature differential detector according to the sixth embodiment of the present invention. As with the embodiment shown in FIG. 8, a received signal z(t) is quadrature-detected by a quasi-coherent detecting circuit 12. The quasi-coherent detecting circuit 12 outputs a complex detection output to a sampling circuit 14. The sampling circuit 14 samples the detector output every symbol interval T. The sampling circuit 14 outputs a received signal complex sample $z_n$. In the sixth embodiment, the delay circuits $15_1$ to $15_N$ in FIG. 8 are not used. The received signal complex sample $z_n$ is supplied to a metric calculating portion 16 that comprises a metric memory 16A, a path memory 16B, a branch metric calculating portion 16C, a Viterbi algorithm portion 16D, a reference signal calculating portion 16E, and a reference signal memory 16F. The metric calculating portion 16 estimates a transmitted phase difference sequence based on the Viterbi algorithm with M states in the following steps:

Step 1: To select a most likely path to a state $\Delta\phi_n$ at a time point nT from M phase difference states at a time point (n−1)T, a value $h(\Delta\phi_{n-1})$ of a reference signal $h_{n-1}$ of a state $\Delta\phi_{n-1}$ of M states at the time point (n−1)T is read from the reference signal memory 16F. The branch metric calculating portion 16C calculates a branch metric $\lambda(\Delta\phi_{n-1} \to \Delta\phi_n)$ that represents likelihood of transition from the state $\Delta\phi_{n-1}$ at the time point (n−1)T to the state $\Delta\phi_n$ at the time point nT according to equation (30).

Step S2: A path metric $\Lambda(\Delta\phi_{n-1})$ of the state $\Delta\phi_{n-1}$ at the time point (n−1)T is read from the metric memory 16A. The Viterbi algorithm portion 16D adds the branch metric $\lambda(\Delta\phi_{n-1} \to \Delta\phi_n)$ to the path metric $\Lambda(\Delta\phi_{n-1})$ of the state $\Delta\phi_{n-1}$ at the time point (n−1)T so as to obtain a path metric $\Lambda(\Delta\phi_n|\Delta\phi_{n-1})$ of a candidate sequence that passes through the state $\Delta\phi_{n-1}$.

Step S3: The processes at the steps 1 to 3 are repeated for all M states $\Delta\phi_{n-1}$ so as to obtain path metrics of the M candidate sequences. The Viterbi algorithm portion 16D compares path metrics of the M candidate sequences and obtains a state $\Delta\phi_{n-1}'$ with the maximum value. The Viterbi algorithm portion 16D decides the state $\Delta\phi_{n-1}'$ as a state of a surviving path at the time point (n−1)T that leads to the state $\Delta\phi_n$ at the time point nT and stores it in the path memory 16B. The Viterbi algorithm portion 16D defines the path metric $\Lambda(\Delta\phi_n|\Delta\phi_{n-1}')$ as a path metric $\Lambda(\Delta\phi_n)$ of the state $\Delta\phi_n$ at the time point nT and stores it in the metric memory 16A.

Step S4: The reference signal calculating portion 16E calculates a value $h_n(\Delta\phi_n)$ of a reference signal $h_n$ of a state $\Delta\phi_n$ used in the calculation at the next time point (n+1)T corresponding to the following equation and stores it in the reference signal memory 16E corresponding to the path metric $\Lambda(\Delta\phi_n)$:

$$h_n(\Delta\phi_n) = z_n + \beta h_{n-1}(\Delta\phi_{n-1}) \exp j\Delta\phi_n \quad (31)$$

Step S5: The processes at the steps 1 to S4 are repeated for all the M states at the time point nT so as to obtain M surviving paths and path metrics. By comparing the path metrics, a state $\Delta\phi_n'$ with the maximum value is obtained. The path memory 16 is traced back for a predetermined interval D starting from the state $\Delta\phi_n'$. The obtained state is output as a decoded symbol $\Delta\phi_{n-D}$.

Figure 13:
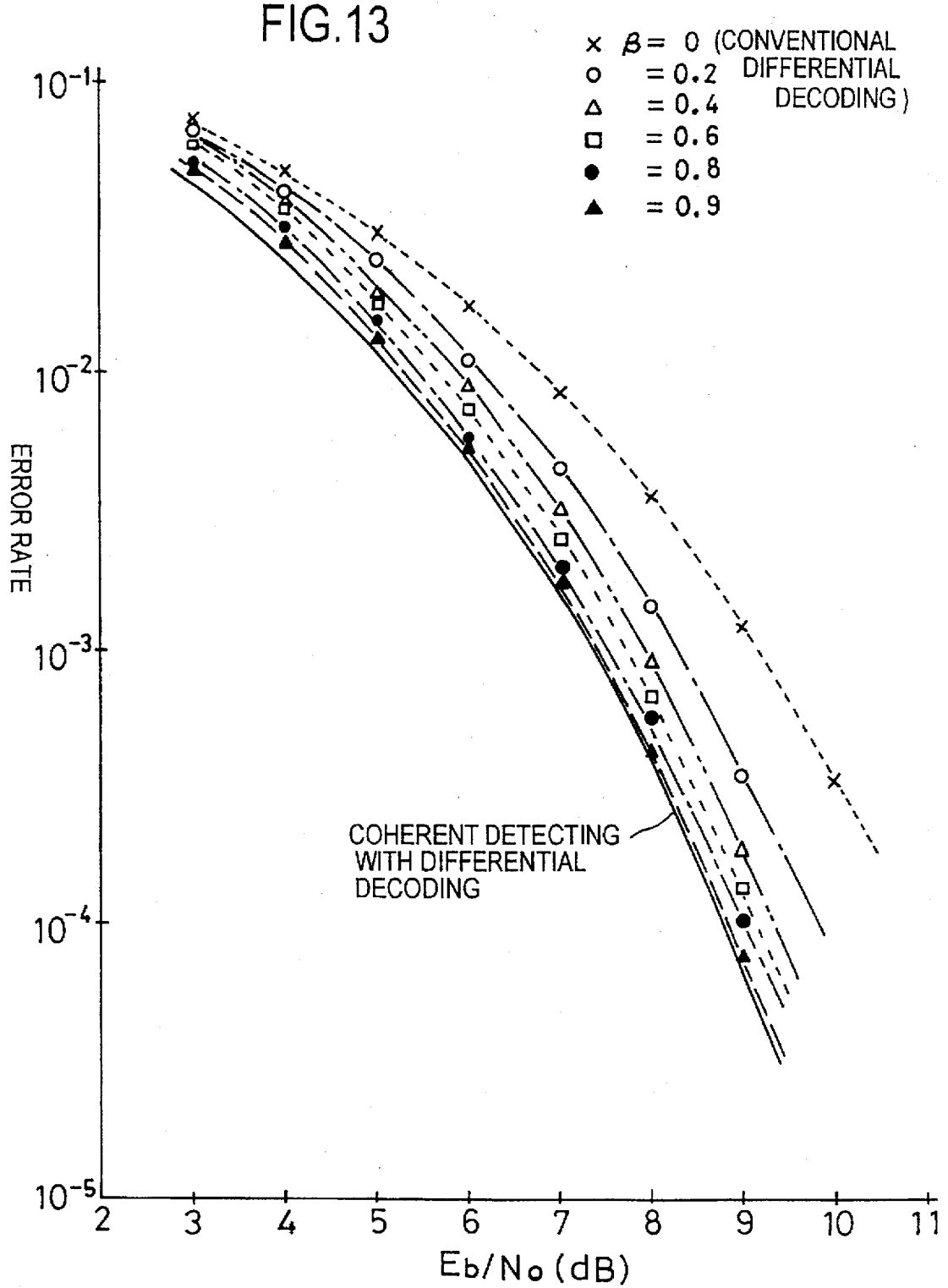
FIG. 13 is a graph showing bit error rate in a computer simulation according to the sixth embodiment.

FIG. 13 is a graph showing results of a computer simulation of error rate performance of a four-phase DPSK system according to the sixth embodiment of the present invention. In the graph, the horizontal axis represents the ratio of signal energy and noise power density per bit (Eb/No). For comparison, results of computer simulation for error rate of conventional symbol-by-symbol differential detection and coherent detecting with differential decoding are plotted in FIG. 13. The difference in Eb/No between conventional symbol-by-symbol differential detection and coherent detecting with differential decoding at error rate of 0.1% is 1.8 dB. However, when $\beta=0.9$, the difference in Eb/No can be reduced to 0.1 dB or less. Thus, according to the sixth embodiment, the computational complexity can be reduced more than that of the third and fourth embodiments. When the forgetting factor β is nearly 1, error rate performance close to coherently detecting and differential decoding method can be almost accomplished without need to increase the calculating amount.

In the sixth embodiment, the number of survival paths at each time point is M. However, in the seventh embodiment, the number of survival paths at each time point is limited to one. Thus, the construction of the seventh embodiment is simplified. The construction of a differential detector according to the seventh embodiment is basically the same as the construction shown in FIG. 12. However, in the seventh embodiment, the metric memory 16A and the path memory 16B are not required. A decoding algorithm of a metric calculating portion 16 according to the seventh embodiment is described in the following steps.

Step S1: To decide which path arriving at one of M states $\Delta\bar{\phi}_n$ at a time point nT from the phase difference state $\Delta\bar{\phi}_{n-1}$ decided at a time point (n−1)T provides the maximum likelihood, a value $h(\Delta\phi_{n-1})$ of a reference signal $h_{n-1}$ corresponding to the decided state $\Delta\bar{\phi}_{n-1}$ at the time point (n−1)T is read from the reference signal memory 16F. The branch metric calculating portion 16C calculates, using the reference value $(\Delta\bar{\phi}_{n-1})$ and the received signal sample $z_n$, a branch metric $\lambda(\Delta\bar{\phi}_{n-1} \to \Delta\phi_n)$ that represents likelihood of transition from the decided state $\Delta\bar{\phi}_{n-1}$ at the time point (n−1)T to one of the M states $\Delta\phi_n$ at the time point nT based on equation (30).

Step S2: The process at the step S1 is repeated for all the M stages $\Delta\phi_n$ so as to obtain branch metrics for the M candidate states. The Viterbi algorithm portion 16D compares the branch metrics and obtains a state $\Delta\phi_n$ with the maximum value and outputs the state $\Delta\phi_n$ as a decoded symbol $\Delta\bar{\phi}_n$. In this decoding method, the path metrics of all the states are 0. Thus, the symbol decision is performed by comparing the branch metrics.

Step S3: The reference signal calculating portion 16E calculates a value $h_n(\Delta\phi_n)$ of a reference signal $h_n$ of the state $\Delta\bar{\phi}_n$ to be used for the calculation at the next time point (n−1)T based on the following equation and stores the obtained value in the reference signal memory 16E.

$$h_n(\Delta\bar{\phi}_n) = z_n + \beta h_{n-1}(\Delta\bar{\phi}_{n-1}) \exp j\Delta\bar{\phi}_n \qquad (32)$$

Figure 14:
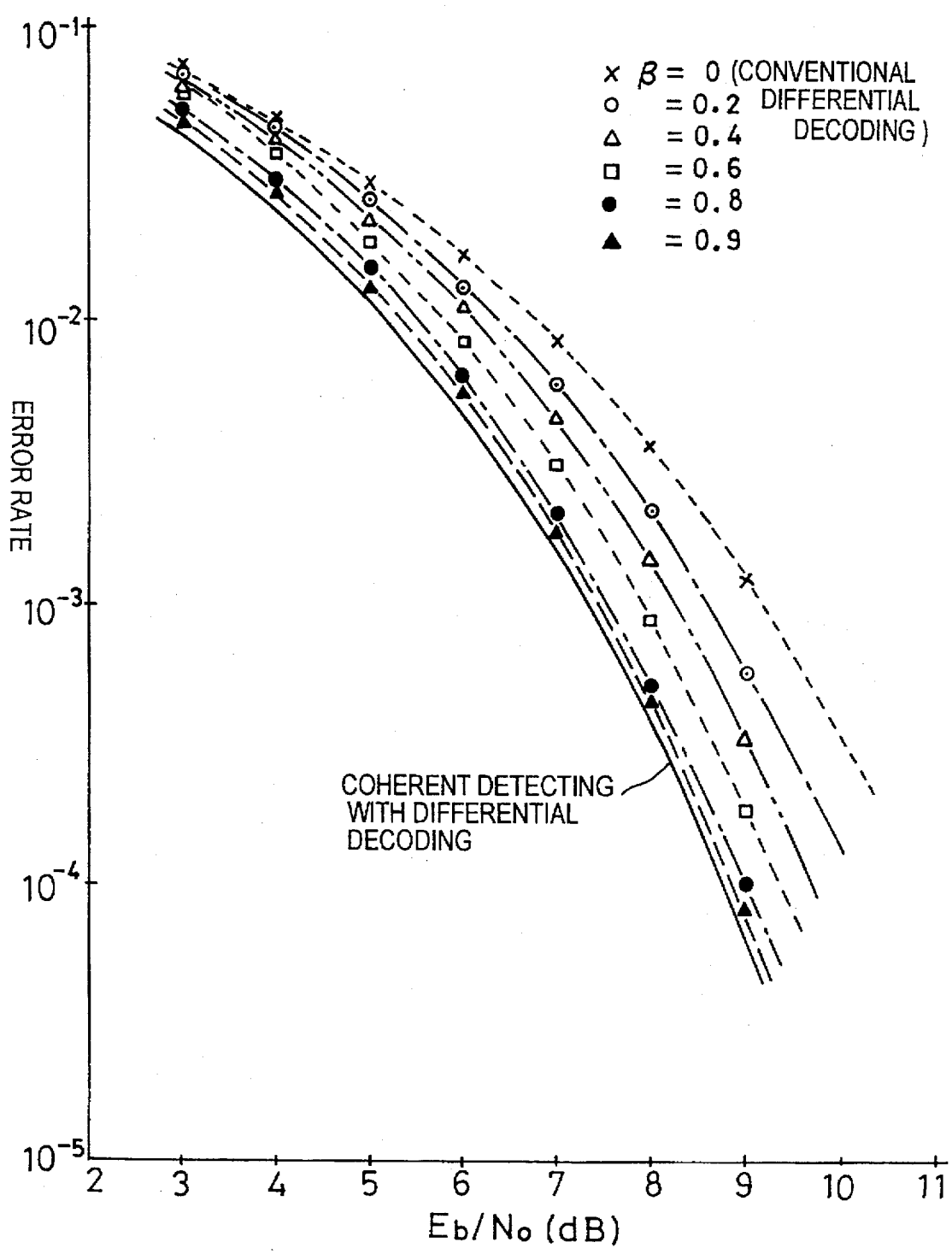
FIG. 14 is a graph showing bit error rate in a computer simulation according to a seventh embodiment of the present invention.

FIG. 14 is a graph showing results of a computer simulation of error rate characteristics of a four-phase DPSK system according to the seventh embodiment. In the graph, the horizontal axis represents the ratio of signal energy and noise power density per bit (Eb/No). As with the sixth embodiment, when β=0.9, the difference in Eb/No between conventional symbol-by-symbol differential detection and coherent detecting with differential decoding can be reduced to 0.1 dB or less.

As described above, in the differential detection method according to the present invention, the error rate can be much more improved than that of conventional symbol-by-symbol differential detection. Thus, error rate performance close to coherent detection with differential decoding can be accomplished. Alternatively, when error rate performance attainable with the conventional method is to be attained, the calculating amount can be much reduced in comparison with the conventional method. In the first, second, third, and fifth embodiments of the present invention, since estimation of maximum likelihood phase difference sequence is performed using detected phase sequences of received signal, a practical limiter amplifier can be used. In addition, since a fast acquisition property that is a feature of differential detection is not lost, the present invention can be applied to burst reception in a TDMA system.

What is claimed is:

1. A differential phase detection method of an M-phase DPSK modulated signal, comprising the steps of:

a) detecting a phase $\Psi_n$ of a received signal at each transmitted symbol interval T with reference to a local signal at a time point nT, where n is any integer;

b) adding a sum of a partial sequence $\{\Delta\phi_i; i=n, n-1, \ldots, n+1-q\}$ of preceding q symbols in a phase difference sequence candidate $\{\Delta\phi_n; n=1, 2, \ldots, N\}$ of N symbols to a detected phase $\Psi_{n-q}$ of q symbols before so as to obtain an estimated value $\Psi_n'$ of the detected phase $\Psi_n$;

c) defining the v-th power value of the absolute value of a phase error $\mu_n(q)$ between the estimated value $\Psi_n'$ and the detected phase $\Psi_n$ as a metric of a q-symbol differential phase detection, where v is a real number that is 1 or greater;

d) adding the metrics for q=1 to n so as to obtain a branch metric expressed by $$\lambda_n = |\mu_n(1)|^v + |\mu_n(2)|^v + \ldots + |\mu_n(n)|^v;$$

e) adding the branch metrics for n=1 to N so as to obtain a path metric $\Lambda = \lambda_1 + \lambda_2 + \ldots + \lambda_N$ for the candidated phase difference sequence $\{\Delta\phi_n; n=1, 2, \ldots, N\}$; and f) defining a phase difference sequence of N symbols with a minimum path metric as a decoded sequence and outputting the decoded sequence.

2. A differential phase detection method of an M-phase DPSK modulated signal, the differential phase detection method using a path memory and a path metric memory, the path memory being adapted for storing, as a surviving path to each of $M^{Q-1}$ states defined by Q modulated phase differences at each time point and a state representing from which one of states at a just preceding time point a most likely path arrives at each of the $M^{Q-1}$ states, the path metric memory being adapted for storing a path metric that represents likelihood of a sequence phase differences leading to each state, where Q is a predetermined integer equal to or greater than 2, the differential phase detection method comprising the steps of:

a) detecting a phase $\Psi_n$ of a received signal at each transmitted symbol interval T with reference to a local signal at a time point nT, where n is any integer;

b) tracing back (L−Q) time points from one state $S_{n-1}$ of the $M^{Q-1}$ states at a time point (n−1)T along a surviving path stored in the path memory, obtaining a sequence of phase differences $\{\Delta\phi_{n-i}; i=1, 2, \ldots, L-1\}$ along the surviving path and adding, as a last symbol, a phase difference $\Delta\phi_n$ at the time point nT to said sequence of phase differences so as to form a candidate phase difference sequence $\{\Delta\phi_{n-i}; i=0, 1, 2, \ldots, L-1\}$, where L is a predetermined integer and L≥Q;

c) adding a detected phase $\Psi_{n-q}$ at a time point (n−q)T to the sum of the phase differences of a partial sequence $\{\Delta\phi_{n-i}; i=0, 1, \ldots, q-1\}$ of the candidate phase difference sequence so as to obtain an estimated value of the phase $\Psi_n$ and calculating the difference between the estimated value and the phase $\Psi_n$ so as to obtain a phase error $\mu_n(q)$;

d) adding the v-th power value of the absolute values of the phase errors $\mu_n(q)$ for q=1 to L so as to obtain the M branch metrics:

$$\lambda_n = |\mu_n(1)|^v + |\mu_n(2)|^v + \ldots + |\mu_n(n)|^v$$

that represent likelihoods of M branches from the $M^{Q-1}$ states $S_{n-1}$ at the time point (n−1)T to a state $S_n$ at the time point nT;

e) adding the M branch metrics $\lambda(S_{n-1} \to S_n)$ arriving at each state at the time point nT to path metrics $\Lambda(S_{n-1})$ of the corresponding states $S_{n-1}$ at the time point (n−1)T that are read out from the metric memory so as to obtain path metric $\Lambda(S_n|S_{n-1})$ of M candidate phase difference sequences that pass through the corresponding M states $S_{n-1}$, and comparing all of the M path metrics $\Lambda(S_n|S_{n-1})$ so as to obtain a state $S_{n-1}'$ with a minimum path metric value;

f) defining the state $S_{n-1}'$ as a state at the time point (n−1)T of a survival path leading to the state $S_n$ at the time point nT, storing the state $S_{n-1}'$ in the path memory, defining the path metric $\Lambda(S_n|S_{n-1}')$ as a path metric $\Lambda(S_n)$ of the state $S_n$ at the time point nT, and storing the path metric $\Lambda(S_n)$ in the path metric memory;

g) repeating the calculations at the above steps b) through f) for all the $M^{Q-1}$ states at the time nT so as to obtain $M^{Q-1}$ path metrics and comparing the $M^{Q-1}$ path metrics so as to obtain a state $S_n'$ with a minimum path metric value; and h) tracing back the path memory for a predetermined interval DT starting from the state $S_n'$, defining a phase difference $\Delta\phi_{n-D}$ that is one of Q−1 phase differences that constructs the state $S_{n-D}$ as a decoded symbol, and outputting the decoded symbol.

3. The differential phase detection method as set forth in claim 2, wherein L=Q.

4. The differential phase detection method as set forth in claim 3, wherein Q=2.

5. The differential phase detection method as set forth in claim 2, wherein L>Q.

6. A quadrature differential detection method of an M-phase DPSK modulated wave, the quadrature differential detection method using a path memory and a path metric memory, the path memory being adapted for storing both M states that represent modulated phase differences at each time point and phase difference states at an immediately preceding time point on maximum likelihood paths each leading to one of the M states at each time, the path metric memory being adapted for storing path metrics that represent likelihoods of sequences leading to each state, the quadrature differential detection method comprising the steps of:

a) sampling a received signal at a time point nT of a transmitted symbol interval T so as to obtain a received signal sample $z_n$;

b) tracing back the path memory starting from one state $\Delta\phi_{n-1}$ of the M states at a time point (n−1)T, obtaining a phase difference sequence $\{\Delta\phi_{n-i}; i=1, 2, \ldots, L-1\}$ along a surviving path to the state $\Delta\phi_{n-i}$, adding a state $\Delta\phi_n$ at the time point nT as a final state to the phase difference sequence to form a candidate phase difference sequence $\{\Delta\phi_{n-i}; i=0, 1, 2, \ldots, L-1\}$;

c) repeatedly rotating, for each of q=1 to L, the phase of a received signal sample $z_{n-q}$ through the sum of a partial sequence $\{\Delta\phi_{n-i}; i=0, 1, 2, \ldots, q-1\}$ of the candidate phase difference sequence to obtain L values, and adding the L values to obtain an estimated value $z_n'$ of the received signal sample $z_n$;

d) calculating a real value of the inner product of the received signal sample $z_n$ and the estimated value $z_n'$ and defining the real value of the inner product as a branch metric $\lambda(\Delta\phi_{n-1} \to \Delta\phi_n)$ that represents likelihood of transition from the state $\Delta\phi_{n-1}$ at the time point (n−1)T to the state $\Delta\phi_n$ at the time point nT;

e) adding the branch metric $\lambda(\Delta\phi_{n-1} \to \Delta\phi_n)$ to a path metric $\Lambda(\Delta\phi_{n-1})$ of the state $\Delta\phi_{n-1}$ at the time point (n−1)T so as to obtain a path metric $\Lambda(\Delta\phi_n|\Delta\phi_{n-1})$ of the candidate phase difference sequence that passes through the state $\Delta\phi_{n-1}$;

f) repeating the above steps b) through e) for all the M states $\Delta\phi_{n-1}$ so as to obtain path metrics of M candidate phase difference sequences and comparing the M candidate phase difference sequences so as to obtain a state $\Delta\phi_{n-1}'$ with a maximum value;

g) deciding the state $\Delta\phi_{n-1}'$ as a state at the time point (n−1)T of a surviving path to the state $\Delta\phi_n$ at the time point nT, storing the state $\Delta\phi_{n-1}'$ in the path memory, defining the path metric $\Lambda(\Delta\phi_n|\Delta\phi_{n-1}')$ as a path metric $\Lambda(\Delta\phi_n)$ of the state $\Delta\phi_n$ at the time point nT, and storing the path metric $\Lambda(\Delta\phi_n)$ in the path metric memory;

h) repeating the above steps b) to g) for all the M states at the time point nT so as to obtain M path metrics and comparing the M path metrics so as to obtain a state $\Delta\phi_n'$ with a maximum path metric value; and i) tracing back the path memory for a predetermined interval DT starting from the state $\Delta\phi_n'$ to reach a state $\Delta\phi_{n-D}$ and outputting the obtained state $\Delta\phi_{n-D}$ as a decoded symbol.

7. A differential phase detection method of an M-phase DPSK modulated signal, comprising the steps of:

a) detecting a phase $\Psi_n$ of a received signal with reference to a local signal at each transmitted symbol interval T:

b) obtaining a phase difference $\Psi_n - \Psi_{n-q}$ between the detected phase $\Psi_n$ and a phase $\Psi_{n-q}$ of up to L symbols before, where q=1, 2, ..., L;

c) obtaining a sum $\delta_{n-1}(q) = \Sigma \Delta\bar{\phi}_{n-i}$, where $\Sigma$ is summation for i=1 to q−1, and obtaining the v-th power value of absolute value of the difference $\mu_n(q)$ between the detected phase difference $\Psi_n - \Psi_{n-q}$ and the sum of the added value $\delta_{n-q}(q)$ and each of M phase difference candidates $\Delta\phi_n'$ as a metric of the q-symbol differential phase detection, where v is a number equal to or greater than 1;

d) adding metrics of the L phase differences so as to obtain a branch metric $n\lambda = |\mu_n(1)|^v + \ldots + |\mu_n(L)|^v$ for the phase difference candidate $\Delta\phi_n'$; and e) outputting the phase difference candidate with a minimum branch metric as a decided phase difference $\Delta\bar{\phi}_n$.

8. A quadrature differential detecting method of an M-phase DPSK modulated signal using a path memory, a path metric memory, and a reference signal memory, the path memory being adapted for storing states at each time point each representing from which one of phase differences starting at a just preceding time point a most likely path arrives at each of M states which represent modulated phase differences, the path metric memory being adapted for storing path metrics representing likelihood of sequences each leading to one of M states, the reference signal memory being adapted for storing a reference signal, the quadrature differential detection method comprising the steps of:

a) sampling a received signal at each transmitted symbol interval T so as to obtain a received signal sample $z_n$ at a time point n;

b) phase-rotating a value $h_{n-1}(\Delta\phi_{n-1})$ of a reference signal $h_{n-1}$ in one of M states $\Delta\phi_{n-1}$ at a time point (n−1)T by $\Delta\phi_n$, calculating a branch metric $\lambda(\Delta\phi_{n-1} \to \Delta\phi_n)$ that represents likelihood of transition from the state $\Delta\phi_{n-1}$ at the time point (n−1)T to the state $\Delta\phi_n$ at the time point nT based on a real value of the inner product of the phase-rotated reference signal value and the received wave sample $z_n$, adding the branch metric $\lambda(\Delta\phi_{n-1} \to \Delta\phi_n)$ to a path metric $\Lambda(\Delta\phi_{n-1})$ of the state $\Delta\phi_{n-1}$ at the time point (n−1)T to obtain a path metric $\Lambda(\Delta\phi_n|\Delta\phi_{n-1})$ of a candidate sequence that passes through the state $\Delta\phi_{n-1}$;

c) repeating the process at the step b) for all M states $\Delta\phi_{n-1}$ so as to obtain path metrics of M candidate sequences, comparing the path metrics so as to obtain a state $\Delta\phi_{n-1}'$ with a maximum value, defining the state $\Delta\phi_{n-1}'$ as a state at the time point (n−1)T of a most likely path leading to the state $\Delta\phi_n$ at the time point nT, storing the state $\Delta\phi_{n-1}'$ in the path memory, and defining the path metric $\lambda(\Delta\phi_n \to \Delta\phi_{n-1}')$ as a path metric $\lambda(\Delta\phi_n)$ of the state $\Delta\phi_n$ at the time point nT, and storing it in the metric memory;

d) calculating the value $h_n(\Delta\phi_n)$ of a reference signal $h_n$ of the state $\Delta\phi_n$, the value $h_n(\Delta\phi_n)$ being to be used for calculations at the next time point (n+1)T, according to the following equation:

$$h_n(\Delta\phi_n) = z_n + \beta h_{n-1}(\Delta\phi_{n-1}) \exp j \Delta\phi_n$$

where $\beta$ is a predetermined constant and $0 < \beta \leq 1$, and storing the value $h_n(\Delta\phi_n)$ in the reference signal memory; and e) repeating the steps b), c), and d) for all M states at the time point nT so as to obtain M surviving paths and path metrics, comparing the path metrics, obtaining a state $\Delta\phi_n'$ with a maximum value, tracing back the path memory for a predetermined time point D starting from the state $\Delta\phi_n'$ to reach a state $\Delta\phi_{n-D}$, and outputting the obtained state $\Delta\phi_{n-D}$ as a decoded symbol.

9. A quadrature differential detection method for an M-phase differential modulated signal using a metric memory and a reference signal memory, the metric memory being adapted for storing a path metric which represents likelihood of a sequence leading to each state, the reference signal memory being adapted for storing a reference signal used for calculating a branch metric of each state, the quadrature differential detection method comprising the steps of:

a) sampling a received signal at each transmitted symbol interval T so as to obtain a received signal sample $z_n$ at a time point nT;

b) rotating the phase of a reference signal $h_{n-1}$ by $\Delta\bar{\phi}_n$ in a determined phase difference state $\Delta\bar{\phi}_{n-1}$ at a time point (n−1)T so as to determine a most likely one of M states $\Delta\phi_n$ at the time point nT and calculating a branch metric $\lambda(\Delta\bar{\phi}_{n-1} \to \Delta\phi_n)$ which represents likelihood of transition from the state $\Delta\bar{\phi}_{n-1}$ at the time point (n−1)T to the state $\Delta\phi_n$ at the time point nT based on a real value of the inner product of the rotated reference signal and the received signal sample $z_n$;

c) repeating the above step b) for all the M states $\Delta\phi_n$ so as to obtain branch metrics of the M sequences, comparing the branch metrics so as to obtain a state $\Delta\phi_n$ with a maximum branch metric value, determining the state $\Delta\phi_n$ as a decoded symbol $\Delta\bar{\phi}_n$ of the received signal sample $z_n$ at the time point nT, and outputting the decoded symbol $\Delta\bar{\phi}_n$; and d) obtaining the value of a reference signal $h_n$ in the state $\Delta\phi_n$ for calculations at the next time point (n+1)T based on the following equation:

$$h_n = z_n + \beta h_{n-1} \exp j \Delta\bar{\phi}_n$$

where $\beta$ is a predetermined constant and $0 < \beta \leq 1$, and storing the value in the reference signal memory.

10. A differential phase detector, comprising:

local signal generating means for generating a local signal with a frequency nearly the same as that of a transmitted signal modulated with M-phase DPSK at symbol intervals T;

phase detecting means for receiving the transmitted signal and detecting the phase of the received signal with reference to the phase of the local signal;

sampling means for sampling the phase of the received signal every symbol interval T and outputting a sampled phase $\Psi_n$;

delay means having N delay stages connected in series and each causing delay for the symbol interval T, where N is an integer that is 2 or greater, said delay means being adapted for receiving the sampled phase from said sampling means and outputting past sampled phases $\Psi_{n-1}, \Psi_{n-2}, \ldots, \Psi_{n-N}$ of 1 to N symbols before; and metric calculating means for receiving the present sampled phase from said sampling means and N past sampled phases from the delay stages of said delay means, adding the sum of a partial sequence $\{\Delta\phi_i; i=n, n-1, \ldots,$ and $n+1-q\}$ of q symbols before in an N-symbol phase difference sequence candidate $\{\Delta\phi_n; n=1, 2, \ldots, N\}$ to a detected phase $\Psi_{n-q}$ of q symbols before so as to obtain an estimated value $\Psi_n'$ of the phase $\Psi_n$, defining the v-th power value of the absolute value of a difference $\mu_n(q)$ between the estimated value $\Psi_n'$ and the phase $\Psi_n$ as a metric of a q-symbol phase detection, where v is any real number that is 1 or greater, adding the metric from q=1 to n so as to obtain the following branch metric $$\lambda_n = |\mu_n(1)|^v + |\mu_n(2)|^v + \ldots + |\mu_n(n)|^v,$$

adding the branch metric from n=1 to N so as to obtain a path metric $\Lambda = \lambda 1 + \lambda 2 + \ldots + \lambda N$ of the phase difference sequence candidate $\{\Delta\phi_i; i=1, 2, \ldots, N\}$, and outputting an N-symbol phase difference sequence with a minimum path metric as a decoded sequence.

11. A differential phase detector for successively estimating a sequence of phase differences at symbol intervals of a phase signal obtained by phase-detecting an M-phase DPSK modulated signal based on a Viterbi algorithm with $M^{Q-1}$ states defined by past (Q−1) phase difference sequence so as to decode the phase difference sequence, where Q is a predetermined integer that is 2 or greater, the differential phase detector comprising:

local signal generating means for generating a local signal with a frequency nearly the same as that of a transmitted signal modulated according to M-phase DPSK modulation at symbol intervals T;

phase detecting means for receiving the transmitted signal and detecting the phase of the received signal relative to the phase of the local signal;

sampling means for sampling the phase of the received wave every symbol interval T and outputting a sampled phase $\Psi_n$;

delay means having L delay stages connected in series and each causing delay for the symbol interval T, where L is an integer and $Q \leq L$, said delay means being adapted for receiving the sampled phase from said sampling means and outputting past sampled phases $\Psi_{n-1}, \Psi_{n-2},$ ..., $\Psi_{n-L}$ of 1 to L symbols before; and metric calculating means having a path memory and a path metric memory, the path memory being adapted for successively storing the states of surviving paths at the just preceding time point each leading to one of $M^{Q-1}$ states, the path metric memory being adapted for storing path metrics that represent likelihood of surviving sequences each leading to one of $M^{Q-1}$ states, said metric calculating means being adapted for receiving (L−1) sampled phases $\Psi_{n-1}, \Psi_{n-2}, \ldots, \Psi_{n-L}$ at phase time points (n−1)T, (n−2)T, ..., (n−L+1)T from the delay portions of said delay means and decoding the sampled phases based on the Viterbi algorithm with the $M^{Q-1}$ states, wherein said metric calculating means is adapted for adding the sum of a partial sequence $\{\Delta\phi_i; i=n, n-1, \ldots, n+1-q\}$ of q symbols in an L-symbol phase difference sequence candidate $\{\Delta\phi_n; n=1, 2, \ldots, L\}$ to a detected phase $\Psi_{n-q}$ of q symbols before so as to obtain an estimated value $\Psi_n'$ of the phase $\Psi_n$, defining the v-th power value of the absolute value of a difference $\mu_n(q)$ between the estimated value $\Psi_n'$ and the phase $\Psi_n$ as a metric of q-symbol differential phase detection, where v is a real number that is 1 or greater, calculating a metric $\lambda_n(S_{n-1} \to S_n)$ of M branches that leave $M^{Q-1}$ states $S_{n-1}=(\Delta\phi_{n-(Q-1)}, \ldots, \Delta\phi_{n-2}, \Delta\phi_{n-1})$ at the time point (n−1)T to each state $S_n=(\Delta\phi_{n-(Q-2)}, \ldots, \Delta\phi_{n-1}, \Delta\phi_n)$ at the time point nT according to the following equation:

$$\lambda_n = |\mu_n(1)|^v + |\mu_n(2)|^v + \ldots + |\mu_n(L)|^v,$$

calculating path metrics of the M branches to the states $S_n$ according to the following equation:

$$\Lambda_n(S_n|S_{n-1}) = \Lambda_{n-1}(S_{n-1}) + \lambda_n(S_{n-1} \to S_n)$$

defining a branch with a minimum path metric as a surviving path to the state $S_n$, storing the surviving path in the path memory, defining the value of the minimum path metric as a path metric $\Lambda_n(S_n)$ of the state $S_n$, storing the path metric $\Lambda_n(S_n)$ in the metric memory, selecting a path leading to a state with a minimum path metric $\Lambda_n(S_n)$ of all the $M^{Q-1}$ states $S_n$ at the time point nT, tracing back states stored in the path memory along the selected path for an interval DT, and outputting a phase difference $\Delta\phi_{n-D}$ of states $(\Delta\phi_{n-(D+Q-2)}, \ldots, \Delta\phi_{n-(D+1)}, \Delta\phi_{n-D})$ as a decoded result $\Delta\phi_{n-D}'$.

12. A differential phase detector, comprising:

local signal generating means for generating a local signal with the same frequency as that of a received signal M-phase DPSK modulated at symbol intervals T;

phase detecting means for detecting the phase of the received signal relative to the local signal and outputting the detected phase $\Psi_n$ at the symbol intervals T;

phase difference detecting means for obtaining a phase difference $(\Psi_n - \Psi_{n-q})$ between the detected phase $\Psi_n$ and a phase $\Psi_{n-q}$ of up to L symbols before, where L is an integer that is 2 or greater;

cumulating means for cumulating decided phase differences $\delta_{n-1}(q) = \Sigma \Delta\bar{\phi}_{n-i}$, where $\Sigma$ is the sum of the phase differences from i=1 to q−1;

metric calculating means for calculating the v-th power value of the absolute value of the difference between the detected phase difference $\Psi_n - \Psi_{n-q}$ and a sum of the added value $\delta_{n-1}(q)$ and a phase difference candidate $\Delta\phi_n'$ as a metric $\lambda_q$ of a q-symbol differential phase detection, adding L metrics of the differential phase detection so as to obtain a branch metric $\lambda_n = |\mu_n(1)|^v + \ldots + |\mu_n(L)|^v$, and outputting a phase difference candidate with a minimum branch metric as a decided phase difference $\Delta\bar{\phi}_n$.

13. The differential phase detector as set forth in claim 12, wherein said phase difference detecting means includes delay means having L delay stages and L subtracters, the L delay stages being connected in series and each causing delay for a symbol interval T, the L subtracters being adapted for successively receiving detected phases from said phase detecting means and outputting past sampled phases $\Psi_{n-1}, \Psi_{n-2}, \ldots, \Psi_{n-L}$ of up to 1 to L symbols before, the subtracters being adapted for subtracting the output phases of the delay stages from the detected phase $\Psi_n$ received from said phase detecting means and outputting the phase difference $\Psi_n - \Psi_{n-q}$.

14. The differential phase detector as set forth in claim 12, wherein said cumulating means has delay means and (L−1) adders, the delay means having L delay stages connected in series and each causing delay for a symbol interval T, the adders being adapted for receiving successively decided phase differences from said metric calculating means, receiving past decided phase differences $\Delta\bar{\phi}_{n-1}, \Delta\bar{\phi}_{n-2}, \ldots \Delta\bar{\phi}_{n-L}$ of 1 to L symbols before from the delay stages, cumulating the output phases of the delay stages, and generating a sum $\delta_{n-1}(q) = \Sigma \Delta\bar{\phi}_{n-i}$ from i=1 to q−1 and from q=2 to L.

15. A quadrature differential detector for receiving and detecting a transmitted signal which has been M-phase DPSK modulated at symbol intervals T, comprising:

local signal generating means for generating two local signals with nearly the same frequency as the transmitted signal and with a phase difference of 90 degrees from each other;

quasi-coherent detecting means for receiving the transmitted signal, quadraturely detecting the received signal with the two local signals, and outputting samples $z_n$ of a complex signal at symbol intervals T;

a path memory for storing a phase difference state at the just preceding time point of a most likely path leading to each of M states that represent modulated phase differences at each time point;

a metric memory for storing a path metric that represents likelihood of a sequence to each state;

a reference signal memory for storing a reference signal to be used for calculating a branch metric for each state;

branch metric calculating means for receiving a received signal sample $z_n$ at a time point nT from said quasi-coherent detecting means, phase-rotating a value $h_{n-1}(\Delta\phi_{n-1})$ of a reference signal $h_{n-1}$ read out from said reference signal memory by $\Delta\phi_n$, and calculating the branch metric $\lambda(\Delta\phi_{n-1} \to \Delta\phi_n)$ that represents likelihood of transition form the state $\Delta\phi_{n-1}$ at the time point (n−1)T to the state $\Delta\phi_n$ at the time [n corresponding) point nT according to a real value of the inner product of the rotated reference signal value and the received signal sample $z_n$;

Viterbi algorithm means for adding the branch metric to a path metric $\Lambda(\Delta\phi_{n-1})$ of the state $\Delta\phi_{n-1}$ at the time point (n−1)T read from said metric memory, repeatedly generating a path metric $\Lambda(\Delta\phi_n|\Delta\phi_{n-1})$ of a candidate phase difference sequence that passes through the state $\Delta\phi_{n-1}$ for all M states $\Delta\phi_{n-1}$, obtaining path metrics of all the M candidate phase difference sequences, comparing the path metrics, obtaining a state $\Delta\phi_{n-1}'$ with a maximum value, deciding the state $\Delta\phi_{n-1}'$ as a state at the time point (n−1)T of a most likely path leading to the state $\Delta\phi_n$ at the time n, storing the state in said path memory, defining the path metric $\Lambda(\Delta\phi_n|\Delta\phi_{n-1}')$ as a path metric $\Lambda(\Delta\phi_n)$ of the state $\Delta\phi_n$ at the time point nT, and storing the path metric $\Lambda(\Delta\phi_n)$ in said metric memory;

reference signal calculating means for calculating a value $h_n(\Delta\phi_n)$ of the reference signal $h_n$ associated with the state $\Delta\phi_n$ according to the following equation:

$$h_n(\Delta\phi_n) = z_n + \beta h_{n-1}(\Delta\phi_{n-1}) \exp j\,\Delta\phi_n$$

wherein $0<\beta\leq 1$, and storing the value $h_n(\Delta\phi_n)$ in said reference signal memory, wherein said Viterbi algorithm means is adapted for obtaining surviving paths and path metrics for all the M states at the time point nT, comparing the path metrics, obtaining a state $\Delta\phi_n'$ with the maximum value, tracing back said path memory for a predetermined interval D starting from the state $\Delta\phi_n'$, and outputting an obtained state $\Delta\phi_{n-D}$ as a decoded symbol.

16. A quadrature differential detector for receiving and detecting a transmitted signal which has been M-phase DPSK modulated at symbol intervals T, comprising:

local signal generating means for generating two local signals with nearly the same frequency as the transmitted signal and with a phase difference of 90 degrees from each other;

quasi-coherent detecting means for receiving the transmitted signal, quadraturely detecting the received signal with the two local signals, and outputting samples $z_n$ of a complex signal at symbol intervals T;

a path memory for storing a phase difference state at the just preceding time point of a most likely path leading to each of M states that represent modulated phase differences at each time point;

a metric memory for storing a path metric that represents likelihood of a sequence to each state;

a reference signal memory for storing a reference signal to be used for calculating a branch metric for each state;

branch metric calculating means for receiving a received signal sample $z_n$ at a time n from said quasi-coherent detecting means, phase-rotating a value of a reference signal $h_{n-1}$ associated with a decided phase difference state $\Delta\bar{\phi}_{n-1}$ at a time point (n−1)T read out from said reference memory by $\Delta\phi_n$, and calculating a branch metric $\lambda(\Delta\bar{\phi}_{n-1} \to \Delta\phi_n)$ that represents likelihood of transition from the state $\Delta\bar{\phi}_{n-1}$ at the time point (n−1)T to the state $\Delta\phi_n$ at the time point nT according to a real value of the inner product of the rotated reference signal and the received signal sample $z_n$;

Viterbi algorithm means for adding the branch metric to a path metric $\lambda(\Delta\bar{\phi}_{n-1} \to \Delta\phi_n)$ to the path metric $\Lambda$ at the time point (n−1)T read from said metric memory, repeatedly generating path metrics $\Lambda(\Delta\phi_n)$ to the M states $\Delta\phi_n$, comparing the path metrics, obtaining a state $\Delta\phi_n$ with the maximum value, determining the state $\Delta\phi_n$ as a decoded symbol $\Delta\bar{\phi}_n$ of the received signal sample $z_n$ at the time point nT, outputting the decoded symbol $\Delta\bar{\phi}_n$, determining the path metric $\Lambda(\Delta\bar{\phi}_n)$ as a path metric $\Lambda$, and storing the path metric $\Lambda$ in said metric memory; and reference signal calculating means for calculating a value of the reference signal $h_n$ associated with the state $\Delta\phi_n$ to be used for calculations at the next time point (n+1)T according to the following equation:

$$h_n = z_n + \beta h_{n-1} \exp j\,\Delta\bar{\phi}_n$$

where $\beta$ is a constant and $0<\beta\leq 1$, and storing the value of the reference signal $h_n$ in said reference signal memory.

* * * * *